(12) United States Patent
Kusano

(10) Patent No.: US 10,609,317 B2
(45) Date of Patent: Mar. 31, 2020

(54) TIME DETECTION CIRCUIT, AD CONVERSION CIRCUIT, AND SOLID-STATE IMAGING DEVICE

(71) Applicant: OLYMPUS CORPORATION, Tokyo (JP)

(72) Inventor: Yosuke Kusano, Tokyo (JP)

(73) Assignee: OLYMPUS CORPORATION, Tokyo (JP)

( * ) Notice: Subject to any disclaimer, the term of this patent is extended or adjusted under 35 U.S.C. 154(b) by 316 days.

(21) Appl. No.: 15/585,445

(22) Filed: May 3, 2017

(65) Prior Publication Data
US 2017/0237928 A1    Aug. 17, 2017

Related U.S. Application Data

(63) Continuation of application No. PCT/JP2014/079938, filed on Nov. 12, 2014.

(51) Int. Cl.
*H04N 5/376* (2011.01)
*H04N 5/378* (2011.01)
(Continued)

(52) U.S. Cl.
CPC ............ *H04N 5/3765* (2013.01); *H03M 1/12* (2013.01); *H03M 1/56* (2013.01); *H04N 5/378* (2013.01)

(58) Field of Classification Search
CPC ... H04N 5/3745–37455; H04N 5/3355; H04N 5/378; H04N 5/3765; H04N 5/376;
(Continued)

(56) References Cited

U.S. PATENT DOCUMENTS

2003/0214598 A1*  11/2003  Shizukuishi ...... H01L 27/14627
                                                        348/308
2005/0099512 A1*   5/2005  Okada ..................... H04N 5/80
                                                      348/231.99
(Continued)

FOREIGN PATENT DOCUMENTS

JP    2012-39386 A    2/2012
JP    2014-127927 A   7/2014
(Continued)

OTHER PUBLICATIONS

Uchida et al., "ITE Technical Report", vol. 37, No. 29, pp. 97-100, Jul. 5, 2013 (partial translation) (cited in the specification).
(Continued)

*Primary Examiner* — Xi Wang
(74) *Attorney, Agent, or Firm* — Westerman, Hattori, Daniels & Adrian, LLP

(57) ABSTRACT

A latch unit that starts an operation of capturing a data signal according to a startup instruction signal and holds the data signal and ends the capturing operation at a timing at which an execution instruction signal is input, a first signal path that transfers a latch timing signal as the startup instruction signal, and a second signal path that transfers the latch timing signal as the execution instruction signal are included, and a first logic element that outputs a first output signal switched to a logical value according to a logical value of an input signal at a first predetermined timing, and a signal maintenance logic circuit that continues to output a second output signal with a predetermined logical value according to the logical value of the input signal until initialization of a reset signal is indicated are arranged in the second signal path.

8 Claims, 10 Drawing Sheets

(51) Int. Cl.
*H03M 1/56* (2006.01)
*H03M 1/12* (2006.01)

(58) Field of Classification Search
CPC ..... H03M 1/00–645; H03M 1/12; H03M 1/56
USPC ....... 341/155–172; 250/208.1; 348/443, 454, 348/294, 295
See application file for complete search history.

(56) References Cited

U.S. PATENT DOCUMENTS

2005/0231624 A1* 10/2005 Muramatsu ........... H03M 1/123
 348/311
2005/0242849 A1* 11/2005 Muramatsu ............ H03K 23/56
 327/151
2009/0256735 A1* 10/2009 Bogaerts .............. H04N 5/3575
 341/169
2014/0183335 A1* 7/2014 Yamazaki .............. H04N 5/378
 250/208.1

FOREIGN PATENT DOCUMENTS

| | | |
|---|---|---|
| JP | 5536584 B2 | 7/2014 |
| WO | 2013/122221 A1 | 8/2013 |
| WO | 2014/038140 A1 | 3/2014 |

OTHER PUBLICATIONS

International Search Report dated Feb. 17, 2015, issued in counterpart International Application No. PCT/JP2014/079938 (2 pages).

* cited by examiner

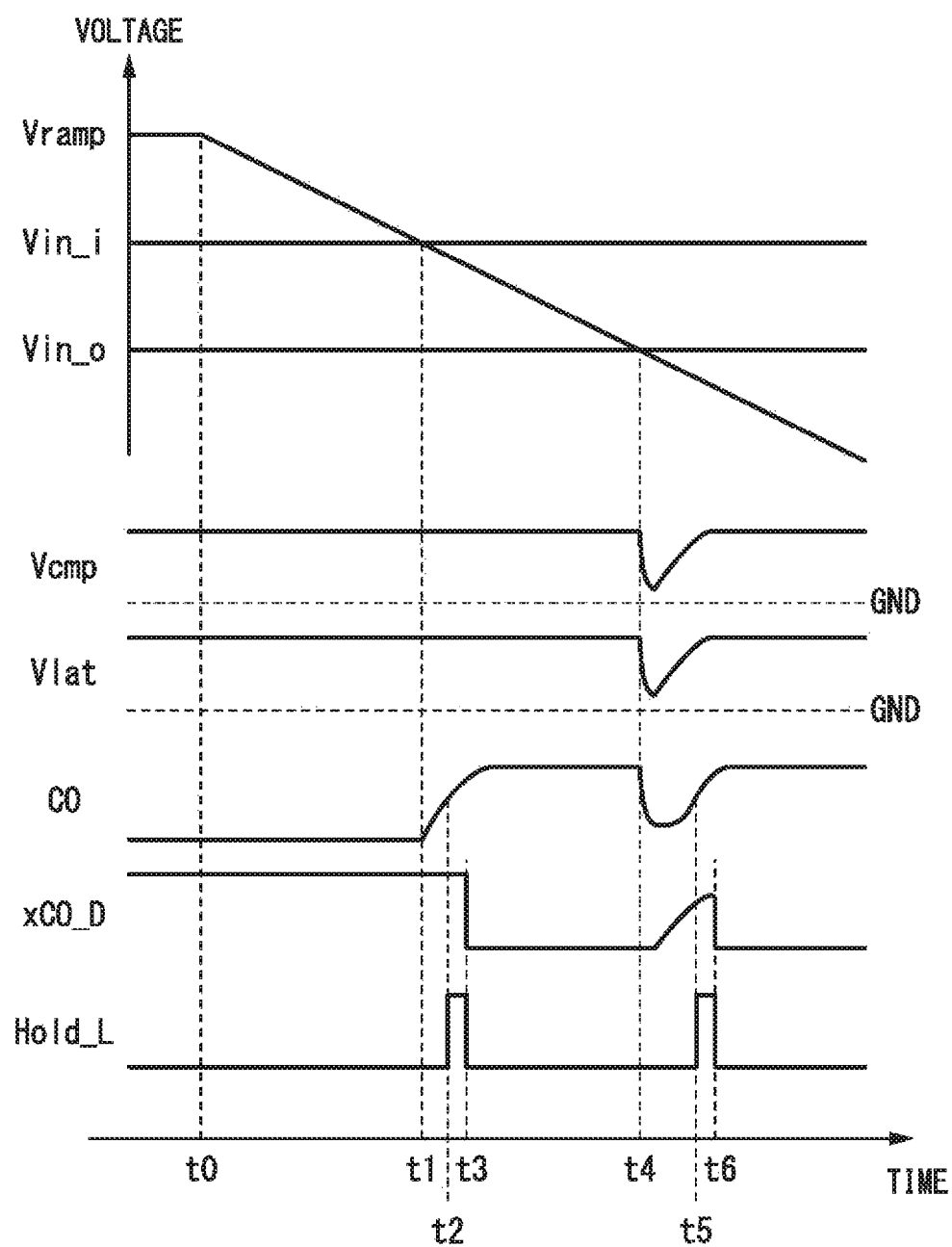

TIME DETECTION CIRCUIT, AD CONVERSION CIRCUIT, AND SOLID-STATE IMAGING DEVICE

This application is a continuation application based on PCT Patent Application No. PCT/JP2014/079938, filed Nov. 12, 2014.

TECHNICAL FIELD

The present invention relates to a time detection circuit, an AD conversion circuit, and a solid-state imaging device.

BACKGROUND ART

In the related art, a solid-state imaging device having a built-in analog-to-digital converter (hereinafter referred to as an "AD conversion circuit") has been put to practical use as a solid-state imaging device mounted on a digital camera, a digital video camera, an endoscope, or the like. In the solid-state imaging device having an AD conversion circuit built thereinto, a column AD conversion circuit includes an AD conversion circuit for each column of a pixel array unit in which pixels are arranged in a matrix form, to realize a so-called column ADC type solid-state imaging device. In the column ADC type solid-state imaging device, a digital signal obtained by the column AD conversion circuit performing analog-to-digital conversion on an analog signal after noise is removed from a pixel signal generated by each pixel arranged in the pixel array unit is output.

Further, a single slope type AD conversion circuit that performs analog-to-digital conversion using a ramp wave is known as one AD conversion circuit built in a solid-state imaging device. The single slope type AD conversion circuit compares an input analog signal (that is, a potential of a pixel signal) with a potential of the ramp wave, and counts the time required from a timing of an initial value of the potential of the ramp wave to inversion of the comparator (a period (time interval) from a timing of start of analog-to-digital conversion to a time when the analog signal and the ramp wave come to the same potential) with a clock at a predetermined frequency to thereby obtain a digital signal indicating a magnitude of the analog signal. In the following description, the AD conversion circuit refers to a single slope type AD conversion circuit.

In the single slope type AD conversion circuit, a time detection circuit detects the length of the time interval (that is, detects the time interval). In a time detection circuit of the related art, a latch unit and a counting unit included in the time detection circuit operate while the length of the time interval is being counted. Therefore, power consumption of the AD conversion circuit including the time detection circuit of the related art depends on the length of the time interval. Accordingly, shortening a period in which the latch unit and the counting unit in the time detection circuit operate (that is, shortening the length of the time interval) is conceivable as a method of reducing the power consumption of the AD conversion circuit. However, in the time detection circuit of the related art, if the length of the time interval is simply shortened, a count value in the latch unit and the counting unit decreases and resolution of the AD conversion circuit is degraded. Therefore, in the time detection circuit of the related art, increasing the frequency of the clock when the length of the time interval is counted is conceivable in order to improve the resolution of the AD conversion circuit. However, in this case, since a frequency at which the latch unit and the counting unit included in the time detection circuit operate increases, power consumption increases. Thus, in the time detection circuit of the related art, it is difficult to achieve both of improvement in resolution and reduction in power consumption. That is, in the AD conversion circuit including the time detection circuit of the related art, it is difficult to achieve both of improvement in resolution and reduction in power consumption when analog-to-digital conversion is performed.

Therefore, for example, Japanese Patent No. 5536584 or "Low-Power-Consumption Driving in Single-Slope ADC with Multi-phase TDC" (Graduate School of Information Science and Technology, Hokkaido University, Daisuke UCHIDA, Makito SOMEYA, Masayuki IKEBE, Junichi MOTOHISA, and Eiichi SANO, ITE Technical Report Vol. 37, No. 29, The Institute of Image Information and Television Engineers, p. 97 to 100, Jul. 5, 2013) (hereafter, "Literature Document 1") discloses a configuration of a time detection circuit capable of reducing power consumption while maintaining resolution when the length of a time interval is detected, and a configuration of an AD conversion circuit including the time detection circuit. If the time detection circuit disclosed in Japanese Patent No. 5536584 or Literature Document 1 is included in an AD conversion circuit, it is possible to reduce power consumption while maintaining resolution when analog-to-digital conversion is performed.

A configuration of an AD conversion circuit of the related art including a time detection circuit disclosed in Japanese Patent No. 5536584 or Literature Document 1 will be described herein. FIG. 8 is a block diagram showing a schematic configuration of the AD conversion circuit of the related art. The AD conversion circuit 8 shown in FIG. 8 includes a clock generation circuit 81, a comparison unit 82, and a time detection circuit 83.

In the clock generation circuit 81, a plurality of delay units DU[0] to DU[7] that delay an input signal by a predetermined time and output a resultant signal are connected in an annular form. A start pulse StartP is input to the first delay unit DU[0]. A plurality of clock signals CK0 to CK7 having different phases are generated at regular intervals from a timing at which the start pulse StartP is input, by the clock generation circuit 81.

The comparison unit 82 receives an analog signal Vin that is a target of analog-to-digital conversion and a ramp wave Vramp of which a potential decreases over time. The comparison unit 82 includes a comparator that inverts a logic of an output signal (=comparison signal CO) at a timing at which a potential of the analog signal Vin and the potential of the ramp wave Vramp match. The comparison unit 82 outputs the comparison signal CO to the time detection circuit 83. In the AD conversion circuit 8 of the related art, a period from a timing at which the comparator begins to compare the potential of the analog signal Vin with the potential of the ramp wave Vramp (that is, a timing at which the analog-to-digital conversion starts) to a timing at which the logic of the comparison signal CO is inverted is the length of the time interval indicating the magnitude of the analog signal Vin. The comparison unit 82 operates with the power supply voltage Vcmp.

The time detection circuit 83 includes a signal generation circuit 831, a latch unit 832, and a counting unit 833. The signal generation circuit 831 includes a delay circuit DLY that outputs a control signal xCO_D obtained by delaying the comparison signal CO input from the comparison unit 82 by a predetermined time and inverting a resultant signal, and a logical product circuit AND that outputs a signal obtained by performing logical product on the comparison signal CO and the control signal xCO_D as a latch driving signal Hold_L. The latch unit 832 includes latch circuits D_0 to D_7 that hold (latch) the logical states (phase states) of the corresponding clock signals CK0 to CK7 when an operation ends, and a logical product circuit AND that outputs a control signal Hold_C obtained by performing logical product on a control signal Enable input from the outside to the AD conversion circuit 8 and the control signal xCO_D input from the signal generation circuit 831. The latch circuits D_0 to D_6 operate according to the latch driving signal Hold_L input from the signal generation circuit 831. Further, the latch circuit D_7 outputs the same output signal as the corresponding clock signal CK7 to the counting unit 833 according to the control signal Hold_C. The counting unit 833 includes a counter circuit that is initialized by a reset signal RST input from the outside to the AD conversion circuit 8, and counts the number of output signals (=clock signal CK7) output from the latch circuit D_7 in the latch unit 832. The respective components in the time detection circuit 83 operate with the power supply voltage Vlat.

The time detection circuit 83 sums the phase states of the clock signals CK0 to CK7 latched by the respective latch circuits D_0 to D_7 in the latch unit 832 and a count value of the clock signal (=clock signal CK7) counted by the counting unit 833 and outputs a result thereof as a digital signal Dout indicating the length of the time interval. A value of the digital signal Dout corresponds to a digital value indicating a voltage (magnitude) of the analog signal Vin.

Next, an operation of the AD conversion circuit 8 of the related art including the time detection circuit disclosed in Japanese Patent No. 5536584 or Literature Document 1 will be described. FIG. 9 is a timing chart showing the operation of the AD conversion circuit 8 of the related art.

First, the potential of the ramp wave Vramp decreases over time from a timing t0 at which the AD conversion circuit 8 starts analog-to-digital conversion. The comparator starts comparison of the potential of the analog signal Vin with the potential of the ramp wave Vramp. Further, at a timing t0, the start pulse StartP is input to the clock generation circuit 81. Accordingly, the clock generation circuit 81 starts an operation, and the leading delay unit DU[0] to which the start pulse StartP has been input outputs an output signal obtained by delaying the start pulse StartP by a predetermined time and inverting a resultant signal to the delay unit DU[1] in a subsequent stage, and outputs the output signal to the time detection circuit 83 as the clock signal CK0. The respective delay units DU[1] to DU[7] also output output signals obtained by delaying the output signals of the delay units DU[0] to DU[6] in a preceding stage by a predetermined time and inverting resultant signals to the delay units DU[2] to DU[0] in a subsequent stage, and output the output signals to the time detection circuit 83 as the clock signals CK1 to CK7. Accordingly, as shown in FIG. 9, the respective clock signals CK0 to CK7 with a phase difference corresponding to a predetermined time are input to the corresponding latch circuits D0 to D7 in the latch unit 832.

Further, since the comparison signal CO output by the comparator is at the "low" level at the timing t0, the latch driving signal Hold_L output by the logical product circuit AND in the signal generation circuit 831 is at a "low" level indicating that the operation of the latch circuits D_0 to D_6 is invalid (disabled). Therefore, the latch circuits D_0 to D_6 do not operate. On the other hand, since the comparison signal CO is at the "low" level, the control signal xCO_D output by the delay circuit DLY is at a "high" level. Further, at the timing t0, the control signal Enable at a "high" level is input from the outside to the AD conversion circuit 8. Accordingly, the control signal Hold_C output by the logical product circuit AND in the latch unit 832 comes to a "high" level indicating that the output of the latch circuit D_7 is valid (enabled), and the latch circuit D_7 outputs the same output signal Q7 as the clock signal CK7 to the counting unit 833. The counter circuit in the counting unit 833 counts the number of output signals Q7.

Thereafter, at a timing t1 at which the potential of the analog signal Vin matches the potential of the ramp wave Vramp, the comparison signal CO output by the comparator is inverted to a "high" level. Accordingly, the latch driving signal Hold_L comes to a "high" level indicating that the operation of the latch circuits D_0 to D_6 is valid (enabled), and the respective latch circuits D_0 to D_6 start the operation of capturing the phase states of the corresponding clock signals CK0 to CK6. Accordingly, respective output signals Q0 to Q6 of the latch circuits D_0 to D_6 come to values indicating the phase states of the clock signals CK0 to CK6.

Thereafter, the control signal xCO_D is inverted to a "low" level at a timing t2 at which a predetermined time for delaying the comparison signal CO in the delay circuit DLY has elapsed. Accordingly, the latch driving signal Hold_L comes to the "low" level (that is, invalid (disabled)), and the respective latch circuits D_0 to D_6 end an operation of capturing phase states of the corresponding clock signals CK0 to CK6, and hold (latch) the phase states of the clock signals CK0 to CK6 at this time. Further, as the control signal xCO_D is inverted to the "low" level at the timing t2, the control signal Hold_C comes to a "low" level indicating invalid (disabled), and the latch circuit D_7 stops output of the output signal Q7 to the counting unit 833, and holds (latches) the phase state of the clock signal CK7 at this time. Accordingly, the counting of the number of the output signals Q7 in the counter circuit of the counting unit 833 is also stopped, and the counter circuit holds a current count value.

Thereafter, the time detection circuit 83 outputs the digital signal Dout according to the phase states of the clock signals CK0 to CK7 latched in the respective latch circuits D_0 to D_7 in the latch unit 832 and the count value of the output signal Q7 counted by the counter circuit in the counting unit 833.

Thus, the time detection circuit 83 disclosed in Japanese Patent No. 5536584 or Literature Document 1 includes the signal generation circuit 831 to operate the latch circuits D_0 to D_6 only in a short period (a period of the "high" level) indicating that the latch driving signal Hold_L is valid (enabled). That is, the latch circuits D_0 to D_6 are operated during the time interval (a period from a timing t0 to a timing t1) in a previous period, whereas the latch circuits D_0 to D_6 are stopped in a period other than a short period in which the latch driving signal Hold_L is at the "high" level. Accordingly, in the AD conversion circuit 8 of the related art including the time detection circuit 83, it is possible to reduce power consumption when the length of the time interval is detected in a state in which the resolution of the analog-to-digital conversion is maintained. In other words, in the AD conversion circuit 8 of the related art, the operation of the signal generation circuit 831 included in the time detection circuit 83 greatly contributes to the reduction in power consumption. Since the column ADC type solid-state imaging device as described above includes the AD conversion circuit 8 of the related art, it is possible to realize low power consumption of the column ADC type solid-state imaging device.

However, in the column ADC type solid-state imaging device, it is conceivable that a power supply is common to the AD conversion circuits arranged in the respective columns. More specifically, in the column ADC type solid-state imaging device, it is conceivable that the power supply voltage Vcmp and the power supply voltage Vlat shown in FIG. 8 are common to the AD conversion circuits 8 included in the respective columns. This is because, in the column ADC type solid-state imaging device, thousands of AD conversion circuits 8 are included corresponding to the respective column since thousands of pixels are arranged in the pixel array unit, and if power supplies for the AD conversion circuits 8 are separately provided, it is difficult to miniaturize the column ADC type solid-state imaging device.

Therefore, in the column ADC type solid-state imaging device in which the column AD conversion circuit is configured with the AD conversion circuits 8 of the related art including the time detection circuit 83, if the time detection circuits 83 included in the plurality of AD conversion circuits 8 simultaneously detect the length of a time interval and operate, a malfunction may occur due to fluctuation in a power supply voltage or a GND of the AD conversion circuit 8. More specifically, in the column ADC type solid-state imaging device, when the analog signals Vin with the same magnitude are input to the plurality of AD conversion circuits 8, a potential of the analog signal Vin matches a potential of the ramp wave Vramp at the same time in the comparators in the comparison units 82 included in the plurality of AD conversion circuits 8, and the logic of the comparison signal CO is inverted. Then, in the column ADC type solid-state imaging device, the comparators in the plurality of comparison units 82 simultaneously operate. Accordingly, the amount of current of the power supply voltage Vcmp greatly changes, and the entire potential of the power supply voltage Vcmp greatly fluctuates. Further, in this case, in the column ADC type solid-state imaging device, the plurality of signal generation circuits 831 simultaneously operate according to the inversion of the logic of the comparison signal CO, and the latch units 832 simultaneously operate due to the latch driving signals Hold_L generated by the respective signal generation circuits 831. Accordingly, in the column ADC solid-state imaging device, a large current instantaneously flows with the power supply voltage Vlat due to operations of the latch unit 832 according to pulses of the latch driving signals Hold_L, and the entire potential of the power supply voltage Vlat greatly fluctuates. In the column ADC type solid-state imaging device, it is conceivable that the detection of the length of the time interval has already been completed and the pulses of the latch driving signals Hold_L are further input to the latch circuits D_0 to D_6 holding the phase states of the clock signals CK0 to CK6 at a timing at which the potentials of the power supply voltage Vcmp and the power supply voltage Vlat that have greatly fluctuated return to an original state. That is, in the column ADC type solid-state imaging device, it is conceivable that the signal generation circuit 831 included in the AD conversion circuit 8 malfunctions due to an influence of the fluctuation in the power supply voltage or the GND.

In the column ADC type solid-state imaging device, in this case, the latch circuits D_0 to D_6 that have already normally held the phase states of the clock signals CK0 to CK6 change the phase states of the clock signals CK0 to CK6 to different phase states (that is, rewrite the normally held phase states), and the length of the time interval cannot be detected normally. Accordingly, the AD conversion circuit 8 cannot perform normal analog-to-digital conversion.

For example, in the column ADC type solid-state imaging device, a state in which the AD conversion circuits 8 arranged in a certain column have already completed the detection of the length of the time interval and hold the phase states of the clock signals CK0 to CK6 is conceivable. Thereafter, in the column ADC type solid-state imaging device, if the plurality of AD conversion circuits 8 arranged in another column simultaneously detect the length of the time interval and simultaneously operate, it is conceivable that the AD conversion circuit 8 that has already completed the detection of the length of the time interval malfunctions due to an influence of fluctuation in the power supply voltage or the GND, and a value of the length of the time interval is rewritten to a different value.

An example of a case in which the AD conversion circuit 8 arranged in a certain column malfunctions due to an influence of fluctuation in a power supply voltage or a GND in a column ADC type solid-state imaging device will be described. FIG. 10 is a timing chart showing an example of a malfunction in the AD conversion circuit 8 of the related art. The timing chart shown in FIG. 10 indicates an example of operation timings in a case in which the analog signal Vin_i is input to an AD conversion circuit 8 arranged in an i-th column and an analog signal Vin_o is input to a plurality of other AD conversion circuits 8 arranged in another column. In FIG. 10, only timings of respective signals of the signal generation circuit 831 in the time detection circuit 83 included in the AD conversion circuit 8 arranged in the i-th column are shown.

First, from a timing t0, the AD conversion circuit 8 arranged in each column starts analog-to-digital conversion. In the following description, the AD conversion circuit 8 arranged in the i-th column is referred to as an "AD conversion circuit 8*i*", and the plurality of AD conversion circuits 8 arranged in the other columns are referred to as "AD conversion circuits 8*o*". Here, the comparator in the comparison unit 82 of the AD conversion circuit 8*i* performs comparison of the potential of the analog signal Vin_i with the potential of the ramp wave Vramp, and the comparator in the comparison unit 82 of the AD conversion circuit 8*o* performs comparison of the potential of the analog signal Vin_o with the potential of the ramp wave Vramp.

Then, from a timing t1 at which the potential of the analog signal Vin_i and the potential of the ramp wave Vramp match, the comparator in the comparison unit 82 of the AD conversion circuit 8*i* starts inversion of logic of the comparison signal CO. At a timing t2 at which the level of the comparison signal CO comes to an input threshold voltage of the logical product circuit AND in the signal generation circuit 831 included in the time detection circuit 83, the latch driving signal Hold_L comes to a "high" level. Further, the delay circuit DLY in the signal generation circuit 831 delays the comparison signal CO by a predetermined time and inverts a resultant signal. If the control signal xCO_D comes to a "low" level at a timing t3, the latch driving signal Hold_L correspondingly comes to the "low" level. Accordingly, the respective latch circuits D_0 to D_6 in the time detection circuit 83 included in the AD conversion circuit 8*i* hold (latch) the phase states of the clock signals CK0 to CK6. This operation of the AD conversion circuit 8*i* is a normal operation.

Thereafter, the AD conversion circuits 8*o* simultaneously operate at a timing t4 at which the potential of the analog signal Vin_o and the potential of the ramp wave Vramp match. Accordingly, the potentials of the power supply voltage Vcmp and the power supply voltage Vlat of the AD conversion circuit 8i may decrease to the vicinity of a level of the GND. In this case, the level of the comparison signal CO output by the comparator in the comparison unit 82 of the AD conversion circuit 8i also decreases according to the decrease in the potentials of the power supply voltage Vcmp and the power supply voltage Vlat.

Thereafter, the potentials of the power supply voltage Vcmp and the power supply voltage Vlat of the AD conversion circuit 8i begin to return to the original state. Accordingly, the comparison signal CO output by the comparator in the comparison unit 82 of the AD conversion circuit 8i returns to the "high" level according to the return of the potential of the power supply voltage Vcmp. However, according to characteristics of a response speed of the comparator, a timing at which the comparison signal CO returns to the "high" level may be later than a timing at which the potential of the power supply voltage Vcmp returns. Then, since the level of the comparison signal CO is at a low level ("low" level), the delay circuit DLY in the signal generation circuit 831 operates to output the control signal xCO_D at a "high" level with the return of the potential of the power supply voltage Vlat. Accordingly, the logical product circuit AND in the signal generation circuit 831 sets the latch driving signal Hold_L to a "high" level at a timing t5 at which the level of the comparison signal CO during the return to the "high" level comes to the input threshold voltage.

Further, the delay circuit DLY in the signal generation circuit 831 delays the "high" level of the level of the comparison signal CO by a predetermined time from the timing t5 at which the level of the comparison signal CO during the return to the "high" level comes to the input threshold voltage, and inverts the resultant level. The delay circuit DLY in the signal generation circuit 831 sets the control signal xCO_D that is about to be set to the "high" level, to the "low" level at a timing t6. The logical product circuit AND in the signal generation circuit 831 sets the latch driving signal Hold_L to a "low" level according to the "low" level of the control signal xCO_D. That is, the signal generation circuit 831 malfunctions to generate the pulse of the latch driving signal Hold_L that comes to the "high" level between the timing t5 and the timing t6 due to the fluctuation in the potentials of the power supply voltage Vcmp and the power supply voltage Vlat.

Accordingly, the respective latch circuits D_0 to D_6 in the AD conversion circuit 8i hold (latch) the phase states at the timing t6 of the clock signals CK0 to CK6. That is, the respective latch circuits D_0 to D_6 in the AD conversion circuit 8i change the phase states of the clock signals CK0 to CK6 held (latched) at a timing t3 normally to the phase states at the timing t6 at which the malfunction has occurred due to the fluctuation in the potentials of the power supply voltage Vcmp and the power supply voltage Vlat of the AD conversion circuits 8i.

Thus, in the configuration of the AD conversion circuit of the related art and, more specifically, in the configuration of the signal generation circuit in the time detection circuit disclosed in Japanese Patent No. 5536584 or Literature Document 1, malfunction caused by fluctuation in the power supply voltage or the GND is a concern. That is, in the configuration disclosed in Japanese Patent No. 5536584 or Literature Document 1, the time detection circuit cannot detect the length of the time interval normally.

SUMMARY OF INVENTION

A time detection circuit of a first aspect of the present invention includes a latch unit that starts an operation of capturing a data signal according to a startup instruction signal, and holds the data signal and ends the capturing operation at a timing at which an execution instruction signal is input during the capturing operation; a first signal path that transfers a latch timing signal that transitions from a low potential to a high potential or from a high potential to a low potential taking a predetermined time, as the startup instruction signal; and a second signal path that transfers the latch timing signal as the execution instruction signal, the second signal path being different from the first signal path, wherein a first logic element that outputs a first output signal switched to a logical value according to a logical value of an input signal at a first predetermined timing, a logical value of the first output signal being determined according to the logical value of the input signal; and a signal maintenance logic circuit that continues to output a second output signal with a predetermined logical value according to the logical value of the input signal until the logical value is switched to a logical value indicating that a logical value of an input reset signal is initialized are arranged in the second signal path.

According to a second aspect of the present invention, in the time detection circuit of the first aspect, the first logic element may receive the latch timing signal as the input signal, and output the first output signal switched to a logical value according to a logical value of the latch timing signal at the first timing, and the signal maintenance logic circuit may be arranged in the second signal path on the output side of the first logic element, and output the second output signal according to the logical value of the first output signal, as the execution instruction signal.

According to a third aspect of the present invention, in the time detection circuit of the second embodiment, a logical value of a third output signal may be determined according to the logical value of the input signal, and a second logic element that outputs the third output signal switched to a logical value according to the logical value of the input signal at a second predetermined timing different from the first timing may be arranged in the first signal path, and the second timing may be a timing at which the logical value of the third output signal is switched before a timing at which the logical value of the first output signal is switched when the same signal is simultaneously input as the input signal of the first logic element and the second logic element.

According to a fourth aspect of the present invention, in the time detection circuit of the third embodiment, the first logic element may output the first output signal switched to a logical value according to the logical value of the latch timing signal at a timing at which a potential of the latch timing signal input as the input signal crosses a first predetermined threshold value, the second logic element may output the third output signal switched to the logical value according to the logical value of the latch timing signal at a timing at which the potential of the latch timing signal input as the input signal crosses a second predetermined threshold value different from the first predetermined threshold value, and the second threshold value may be a threshold value to which the logical value of the third output signal is switched at a timing before a timing at which the logical value of the first output signal is switched when the same latch timing signal is simultaneously input as the input signal of the first logic element and the second logic element.

According to a fifth aspect of the present invention, in the time detection circuit of the first aspect, the signal maintenance logic circuit may receive the latch timing signal as the input signal, and output the second output signal according to a logical value of the latch timing signal, and the first logic element may be arranged in the second signal path on the output side of the signal maintenance logic circuit, and output the first output signal switched to a logical value according to a logical value of the second output signal, as the execution instruction signal, at the first timing.

According to a sixth aspect of the present invention, in the time detection circuit of the first aspect, a latch driving signal for driving the latch unit may be generated on the basis of the startup instruction signal and the execution instruction signal.

An AD conversion circuit of a seventh aspect of the present invention includes: a signal output unit that compares a potential of an input analog signal with a potential of a ramp wave that is an analog reference signal of which a potential monotonously decreases or monotonously increases at a constant rate with respect to time, and outputs a latch timing signal that transitions from a low potential to a high potential or from a high potential to a low potential taking a predetermined time from a time at which the potential of the ramp wave satisfies a predetermined condition for the potential of the analog signal; a clock generation circuit that generates a plurality of clock signals with different phases at predetermined regular intervals; the time detection circuit according to the first aspect that holds states of phases of the plurality of clock signals in the latch unit, and outputs phase information indicating the held phase states of the plurality of clock signals; and a counting unit that outputs a count value obtained by counting the number of any one of the plurality of clock signals, wherein a digital signal indicating a magnitude of the input analog signal is output on the basis of the count value and the phase information.

A solid-state imaging device of an eighth aspect of the present invention includes a pixel array unit in which a plurality of pixels that generate a photoelectric conversion signal according to the amount of incident light are arranged in a two-dimensional matrix form; a reference signal generation unit that generates a ramp wave that is an analog reference signal of which a potential monotonically decreases or monotonically increases at a constant rate with respect to time; and the plurality of AD conversion circuits according to the seventh aspect that are arranged for each column or each plurality of columns of the pixel array unit and output a digital signal indicating a magnitude of the pixel signal according to the photoelectric conversion signal generated by the pixel, wherein one clock generation circuit of the AD conversion circuit is common to all of the AD conversion circuits.

BRIEF DESCRIPTION OF DRAWINGS

FIG. 10 is a timing chart showing an example of a malfunction in the AD conversion circuit of the related art.

DESCRIPTION OF EMBODIMENTS

First Embodiment

Figure 1:
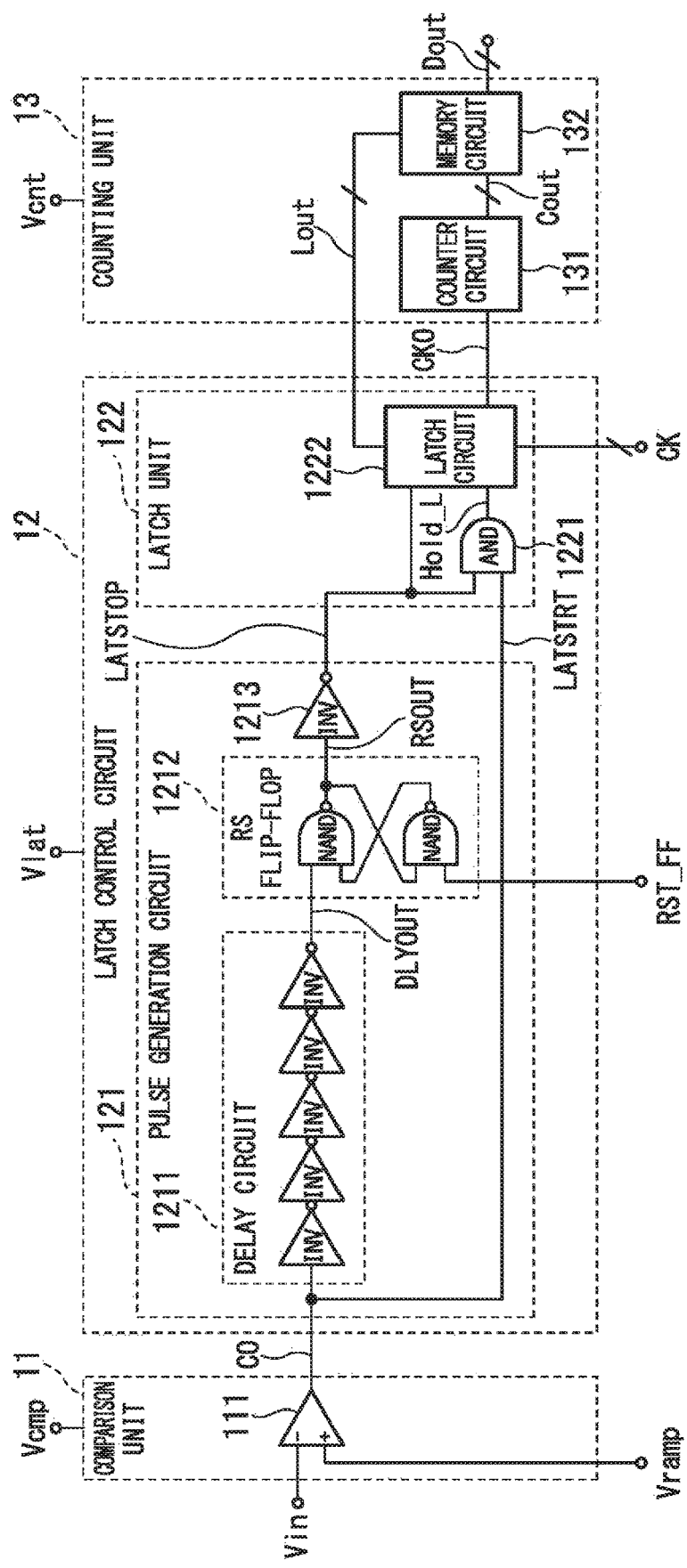
FIG. 1 is a block diagram showing a schematic configuration of an AD conversion circuit including a time detection circuit of a first embodiment of the present invention.

Hereinafter, embodiments of the present invention will be described with reference to the drawings. FIG. 1 is a block diagram showing a schematic configuration of an AD conversion circuit including a time detection circuit of a first embodiment of the present invention. An AD conversion circuit 1 shown in FIG. 1 includes a comparison unit 11, a latch control circuit 12, and a counting unit 13. In the configuration of the AD conversion circuit 1 shown in FIG. 1, the latch control circuit 12 and the counting unit 13 constitute a time detection circuit of the first embodiment. However, the time detection circuit of the first embodiment may have a configuration in which at least a latch control circuit 12 is included.

The AD conversion circuit 1 further includes a clock generation circuit in which a plurality of delay units are connected in an annular shape and that outputs a plurality of clock signals CK with different phases at regular intervals, but the clock generation circuit is not shown in FIG. 1. A configuration and an operation of the clock generation circuit (not shown) are the same as those of the clock generation circuit 81 included in the AD conversion circuit 8 of the related art shown in FIG. 8. Therefore, a detailed description of components and an operation of the clock generation circuit (not shown) will be omitted. The time detection circuit of the first embodiment may include the clock generation circuit (not shown) as a component.

The comparison unit 11 includes a comparator 111. An analog signal Vin that is a target of analog-to-digital conversion and a ramp wave Vramp of which a potential decreases over time are input to the comparator 111. The comparison unit 11 starts logic inversion of an output signal (=comparison signal CO) from a timing at which a potential of the analog signal Vin matches the potential of the ramp wave Vramp. The comparison unit 11 outputs the comparison signal CO output by the comparator 111 to the latch control circuit 12. In the AD conversion circuit 1, a period from a timing at which the comparator 111 starts comparison of the potential of the analog signal Vin with the potential of the ramp wave Vramp (that is, a timing at which the analog-to-digital conversion starts) to a time when the logic of the comparison signal CO is inverted is the length of a time interval indicating a magnitude of the analog signal Vin. Further, the comparison unit 11 operates with a power supply voltage Vcmp.

The latch control circuit 12 includes a pulse generation circuit 121 and a latch unit 122. The pulse generation circuit 121 includes a delay circuit 1211, an RS flip-flop 1212, and a logic NOT circuit (hereinafter referred to as an "INV circuit") 1213. The latch unit 122 includes a logical product circuit (hereinafter referred to as an "AND circuit") 1221 and a latch circuit 1222. Each component of the latch control circuit 12 operates with a power supply voltage Vlat.

The pulse generation circuit 121 generates a control signal for controlling a timing at which the latch unit 122 holds (latches) a logic state (phase state) of the plurality of clock signals CK with different phases output from the clock generation circuit (not shown) on the basis of the comparison signal CO input from the comparison unit 11. The pulse generation circuit 121 outputs the comparison signal CO input from the comparison unit 11 as it is, to the latch unit 122 as the latch startup instruction signal LATSTRT indicating a timing at which the latch unit 122 starts an operation of capturing a phase state of the clock signal CK.

The delay circuit 1211 outputs a delay signal DLYOUT obtained by delaying the comparison signal CO input from the comparison unit 11 by a predetermined time and inverting a resultant signal, to the RS flip-flop 1212. In FIG. 1, a configuration of the delay circuit 1211 in which five INV circuits are connected in series is shown.

The RS flip-flop 1212 is initialized by a "low" level of a reset signal RST_FF. After the initialization is released (after the reset signal RST_FF comes to a "high" level), the RS flip-flop 1212 holds a logic of the delay signal DLYOUT output from the delay circuit 1211. Further, the RS flip-flop 1212 outputs an output signal RSOUT indicating the held logic of the delay signal DLYOUT to the INV circuit 1213. In FIG. 1, a configuration of the RS flip-flop 1212 in which two negative logical product circuits (hereinafter referred to as "NAND circuits") are connected is shown.

The INV circuit 1213 outputs a signal obtained by inverting the logic of the output signal RSOUT output from the RS flip-flop 1212 to the latch unit 122 as the latch execution instruction signal LATSTOP. The latch execution instruction signal LATSTOP output by the INV circuit 1213 is a signal indicating a timing at which the latch unit 122 ends the operation of capturing the phase state and holds (latches) the phase state of the clock signal CK.

The latch unit 122 captures and holds (latches) the phase state of the plurality of clock signals CK with different phases output from the clock generation circuit (not shown) in response to the control signal output from the pulse generation circuit 121.

The AND circuit 1221 performs logical product on the latch startup instruction signal LATSTRT and the latch execution instruction signal LATSTOP output from the pulse generation circuit 121 to generate a latch driving signal Hold_L indicating a period in which the latch circuit 1222 operates. The latch driving signal Hold_L is a signal that indicates that an operation of the latch circuit 1222 is valid (enabled) when the latch startup instruction signal LATSTRT is at a "high" level and the latch execution instruction signal LATSTOP is at a "high" level, and then, invalidates (disables) the operation of the latch circuit 1222 when the latch execution instruction signal LATSTOP then comes to a "low" level to hold (latch) a current phase state of the clock signal CK. The AND circuit 1221 outputs the generated latch driving signal Hold_L to the latch circuit 1222.

The latch driving signal Hold_L is not limited to the configuration in which the AND circuit 1221 included in the latch unit 122 generates the latch driving signal Hold_L. The latch driving signal Hold_L, for example, may be generated and output by the latch control circuit 12. Further, for example, a waveform generation circuit may be included between the latch control circuit 12 and the latch unit 122, and the waveform generation circuit may generate the latch driving signal Hold_L on the basis of the latch startup instruction signal LATSTRT and the latch execution instruction signal LATSTOP output from the latch control circuit 12.

The latch circuit 1222 includes a plurality of latch circuits corresponding to the plurality of clock signals CK with different phases output from the clock generation circuit (not shown). The latch circuit 1222 performs an operation of capturing the phase state of the corresponding clock signal CK during a period in which the latch driving signal Hold_L output from the AND circuit 1221 indicates that the operation of the latch circuit 1222 is valid (enabled). Further, the latch circuit 1222 ends the operation of capturing the phase state of the corresponding clock signal CK and holds (latches) the phase state of the clock signal CK at this time at a timing at which the latch driving signal Hold_L indicates that the operation of the latch circuit 1222 is invalid (disabled). The latch circuit 1222 outputs phase information Lout indicating the held (latched) phase state of each clock signal CK to the counting unit 13.

Further, the latch circuit 1222 outputs a clock signal CK0 used for the counting unit to count the number of clock signals CK to the counting unit 13 during a period in which the latch execution instruction signal LATSTOP output from the pulse generation circuit 121 indicates the output of the clock signal CK. This clock signal CK0 is generated from any one clock signal CK (for example, a clock signal CK at a top level) among the plurality of clock signals CK with different phases output from the clock generation circuit (not shown).

Figure 8:
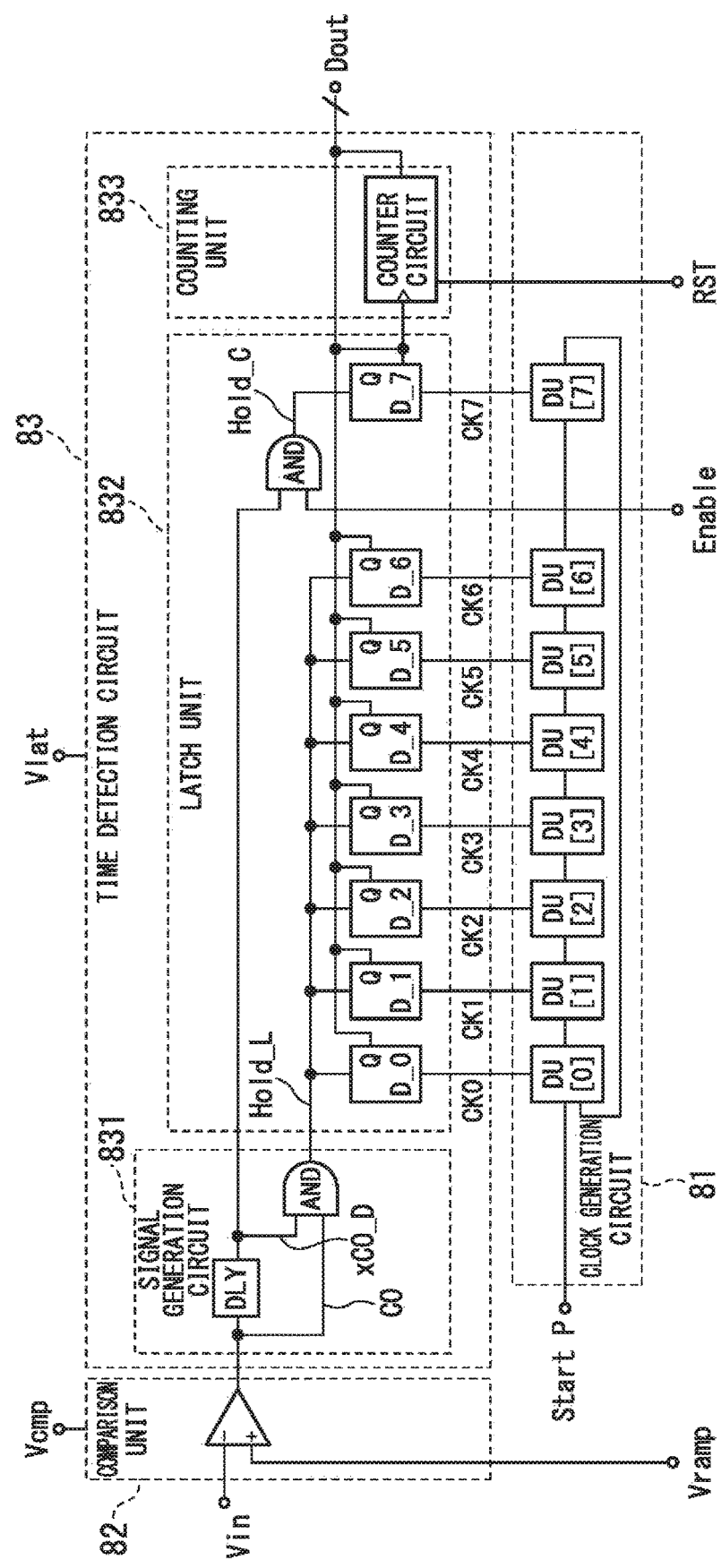
FIG. 8 is a block diagram showing a schematic configuration of an AD conversion circuit of the related art.

The configuration and the operation of the latch circuit 1222 are the same as those of the latch unit 832 included in the AD conversion circuit 8 of the related art shown in FIG. 8. Therefore, a detailed description of components and the operation of the latch circuit 1222 will be omitted.

The counting unit 13 includes a counter circuit 131 and a memory circuit 132. Each of the components in the counting unit 13 operates with a power supply voltage Vcnt.

The counter circuit 131 counts the number of clock signal CK0 output from the latch unit 122 in the latch control circuit 12. The counter circuit 131 outputs a count value Cout indicating a count value of the clock signal CK0 to the memory circuit 132.

The memory circuit 132 temporarily stores the phase information Lout output from the latch unit 122 in the latch control circuit 12 and the count value Cout output from the counter circuit 131. The memory circuit 132 outputs a digital signal Dout indicating the length of the time interval on the basis of the temporarily stored phase information Lout and the temporarily stored count value Cout. For example, the memory circuit 132 outputs the digital signal Dout in which the count value Cout forms upper bits, and the phase information Lout forms lower bits. The value of this digital signal Dout corresponds to a digital value indicating a potential (magnitude) of the analog signal Vin. Further, the memory circuit 132, for example, may be configured to output a digital signal Dout obtained by encoding the phase information Lout and then combining the phase information Lout with the count value Cout.

Figure 9:
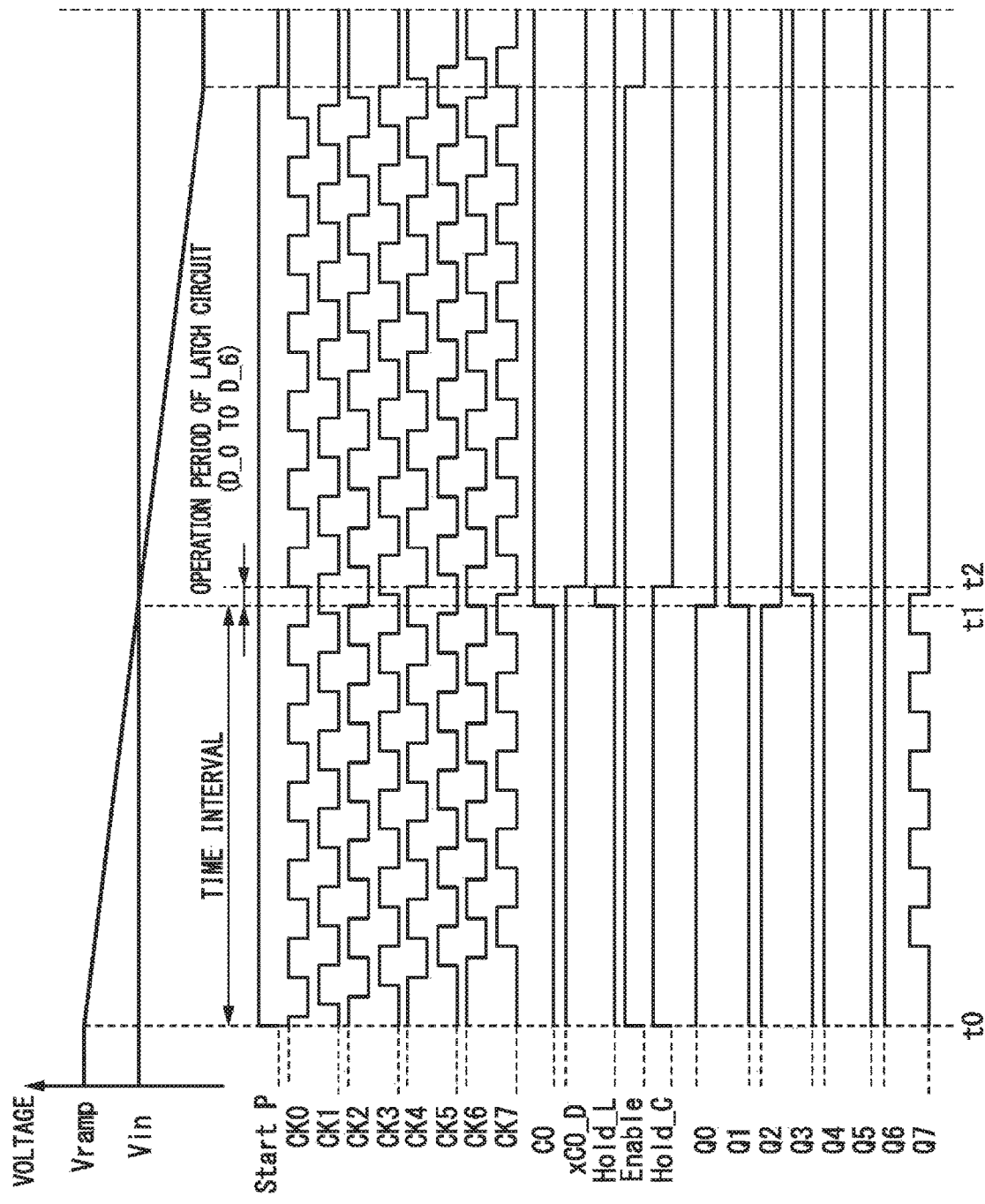
FIG. 9 is a timing chart showing an operation of the AD conversion circuit of the related art.

Next, an operation of the AD conversion circuit 1 will be described. A normal operation of the AD conversion circuit 1 is the same as the normal operation of the AD conversion circuit 8 of the related art shown in FIG. 9. Accordingly, a detailed description of the normal operation of the AD conversion circuit 1 will be omitted. In the following description, an operation of the AD conversion circuit 1 in a case in which a power supply voltage or the GND fluctuates due to simultaneous operation of a plurality of different AD conversion circuits 1 in a configuration in which the plurality of AD conversion circuits 1 are simultaneously included (for example, a column ADC type solid-state imaging device) will be described. In other words, in the following description, the operation of the AD conversion circuit 1 in a situation in which the AD conversion circuit 8 of the related art malfunctions (see FIG. 10) due to a fluctuation in the power supply voltage or the GND will be described.

Figure 2:
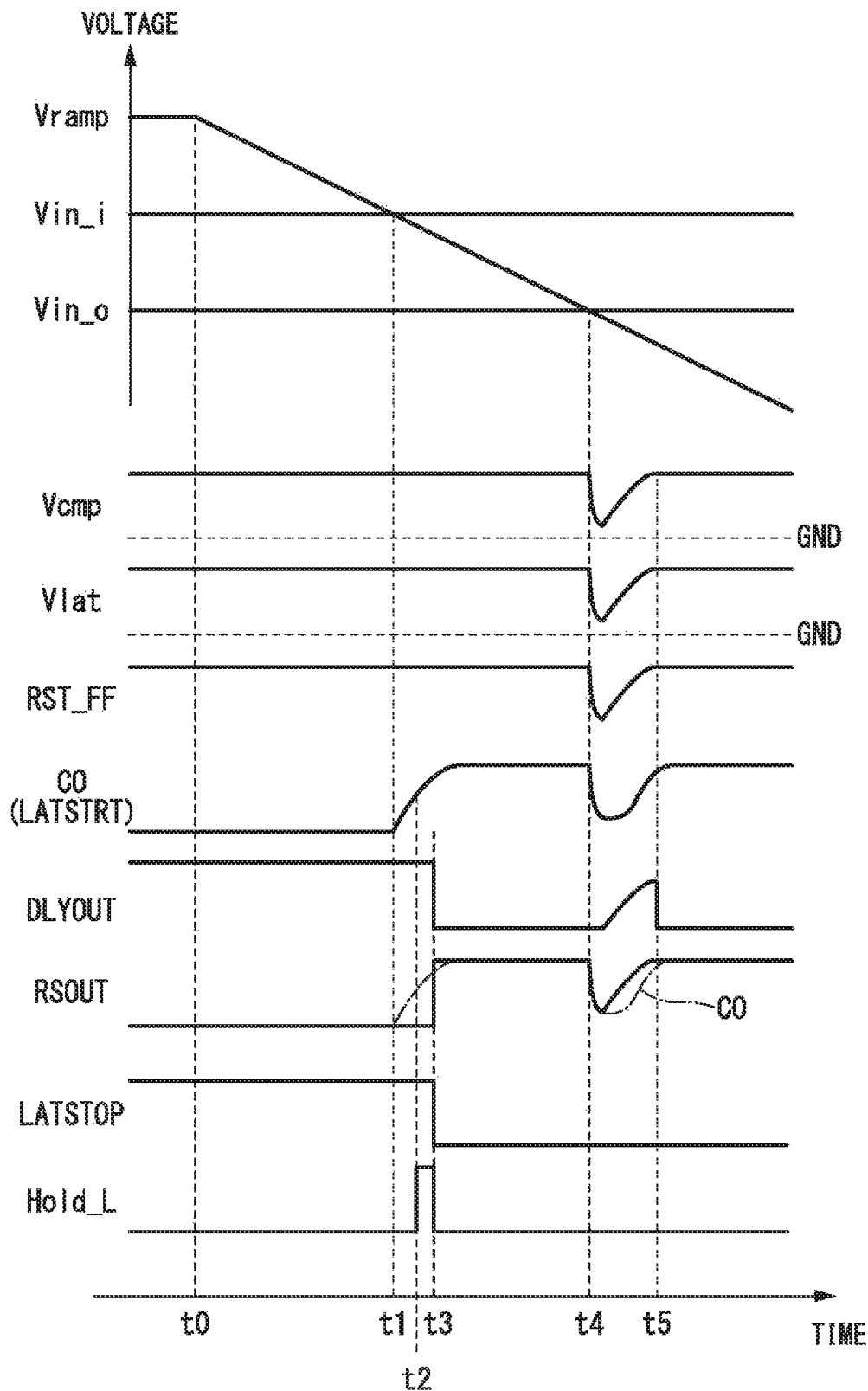
FIG. 2 is a timing chart showing an example of an operation in the time detection circuit of the first embodiment of the present invention.

FIG. 2 is a timing chart showing an example of an operation in the time detection circuit of the first embodiment of the present invention. The timing chart shown in FIG. 2 indicates an example of operation timings in a case in which the analog signal Vin_i is input to any one of AD conversion circuits 1 (hereinafter referred to as an "AD conversion circuit 1i") and the analog signal Vin_o is input to the plurality of other AD conversion circuits 1 (hereinafter to as "AD conversion circuits 1o") in a configuration in which the plurality of AD conversion circuits 1 are simultaneously included, such as in a column ADC type solid-state imaging device. In FIG. 2, only timings of respective signals in the latch control circuit 12 that is a component of the time detection circuit of the first embodiment included in the AD conversion circuit 1i are shown.

First, from a timing t0, each AD conversion circuit 1 starts analog-to-digital conversion. Here, the comparator 111 in the comparison unit 11 of the AD conversion circuit 1i performs comparison of the potential of the analog signal Vin_i with the potential of the ramp wave Vramp, and the comparator 111 in the comparison unit 11 of the AD conversion circuit 1o performs comparison of the potential of the analog signal Vin_o with the potential of the ramp wave Vramp.

Then, from a timing t1 at which the potential of the analog signal Vin_i and the potential of the ramp wave Vramp match, the comparator 111 in the comparison unit 11 of the AD conversion circuit 1i starts inversion of logic of the comparison signal CO. At a timing t2 at which the level of the comparison signal CO (that is, the latch startup instruction signal LATSTRT) comes to an input threshold voltage of the AND circuit 1221 in the latch unit 122, the latch driving signal Hold_L comes to a "high" level. Accordingly, the latch circuit 1222 in the latch unit 122 of the AD conversion circuit 1i starts the operation of capturing the phase state of the clock signal CK.

Further, from the timing t2, the INV circuits included in the delay circuit 1211 of the pulse generation circuit 121 sequentially invert the comparison signal CO to delay and invert the comparison signal CO by predetermined time. At a timing t3, the delay signal DLYOUT transitions to a "low" level. Accordingly, the RS output signal RSOUT output by the RS flip-flop 1212 comes to a "high" level, and the latch execution instruction signal LATSTOP output by the INV circuit 1213 transitions to a "low" level. The latch driving signal Hold_L output by the AND circuit 1221 also transitions to the "low" level.

Accordingly, the latch circuit 1222 in the latch unit 122 of the AD conversion circuit 1i holds (latches) the phase state of the clock signal CK. This operation of the AD conversion circuit 1i is a normal operation.

Then, at a timing t4 at which the potential of the analog signal Vin_o and the potential of the ramp wave Vramp match, the AD conversion circuit 1o operates simultaneously. Accordingly, the potentials of the power supply voltage Vcmp and the power supply voltage Vlat of the AD conversion circuit 1i may decrease to near a level of GND.

In this case, with the decrease in the potentials of the power supply voltage Vcmp and the power supply voltage Vlat, the level of the comparison signal CO output by the comparator 111 in the comparison unit 11 of the AD conversion circuit 1i and the output signal RSOUT output by the RS flip-flop 1212 in the pulse generation circuit 121 also decreases.

Thereafter, the potentials of the power supply voltage Vcmp and the power supply voltage Vlat of the AD conversion circuit 1i begin to return to their original state. Accordingly, the comparison signal CO output by the comparator 111 in the comparison unit 11 of the AD conversion circuit 1i, and the output signal RSOUT also returns to a "high" level with the return of the potentials of the power supply voltage Vcmp and the power supply voltage Vlat.

Here, a case in which characteristics of the response speed of the comparator 111 are the same as those of the AD conversion circuit 8 of the related art shown in FIG. 10 is conceivable. More specifically, a case in which a timing of return of the comparison signal CO to a "high" level is later than a timing at which the potential of the power supply voltage Vcmp returns is conceivable.

First, an operation of the components in the RS flip-flop 1212 during return of the potentials of the power supply voltage Vcmp and the power supply voltage Vlat will be described. The NAND circuit to which the reset signal RST_FF has been input, which constitutes the RS flip-flop 1212, outputs a "low" level, but operates to output a "high" level as the level of the output signal RSOUT decreases to a low level ("low" level). However, the NAND circuit to which the reset signal RST_FF has been input cannot output a "high" level as the potential of the power supply voltage Vlat decreases, and the output thereof remains at a "Low" level and does not change. Therefore, the NAND circuit that outputs the output signal RSOUT operates to output a "high" level due to the output of the NAND circuit to which the reset signal RST_FF has been input, and returns to a "high" level at the timing at which the potential of the power supply voltage Vlat returns. Therefore, a timing at which the output signal RSOUT output by the RS flip-flop 1212 returns to a "high" level is not later than the timing at which the potential of the power supply voltage Vcmp and the power supply voltage Vlat returns. In FIG. 2, a waveform of the comparison signal CO (=latch startup instruction signal LATSTRT) is indicated by a dash-dotted line according to a waveform of the output signal RSOUT.

Next, an operation of the INV circuit 1213 during return of the potentials of the power supply voltage Vcmp and the power supply voltage Vlat will be described. Although the INV circuit 1213 outputs a "low" level, the INV circuit 1213 operates to output a "high" level as the level of the output signal RSOUT decreases to a low level ("low" level). However, the INV circuit 1213 cannot output a "high" level since the potential of the power supply voltage Vlat decreases, similar to the NAND circuit to which the reset signal RST_FF has been input. That is, the latch execution instruction signal LATSTOP output by the INV circuit 1213 does not change and remains at a "low" level.

Accordingly, the AND circuit 1221 in the latch unit 122 continues to output the latch driving signal Hold_L at a "low" level even when the level of the comparison signal CO during return to the "high" level comes to the input threshold voltage.

The delay circuit 1211 of the pulse generation circuit 121 delays the "high" level of the comparison signal CO by a predetermined time and inverts the resultant level, by the respective INV circuits sequentially inverting the comparison signal CO, from a timing at which the level of the comparison signal CO during return to the "high" level comes to the input threshold voltage. However, a change in the delay signal DLYOUT output by the delay circuit 1211 does not influence the output signal RSOUT output by the RS flip-flop 1212 since the change is at the same timing as that at which the potential of the power supply voltage Vlat returns. That is, when the delay signal DLYOUT comes to a "low" level at a timing t5, the output signal RSOUT output by the RS flip-flop 1212 comes to a "high" level.

Accordingly, even when the potentials of the power supply voltage Vcmp and the power supply voltage Vlat of the AD conversion circuit 1*i* fluctuate, the latch circuit 1222 in the latch unit 122 of the AD conversion circuit 1*i* does not hold (latch) the phase state of the clock signal CK at this time. That is, the AD conversion circuit 1*i* does not malfunction due to the fluctuation in potentials of the power supply voltage Vcmp and the power supply voltage Vlat, which occurs between the timing t4 and the timing t5 due to a simultaneous operation of the AD conversion circuit 1*o*.

According to the first embodiment, a time detection circuit (at least, the latch control circuit 12) is configured, in which the time detection circuit includes a latch unit (the latch unit 122) that starts an operation of capturing a data signal (the plurality of clock signals CK) according to a startup instruction signal (the latch startup instruction signal LATSTRT), and holds the data signal (the logic state (phase state) of the plurality of clock signals CK) and ends the capturing operation at a timing at which an execution instruction signal (the latch execution instruction signal LATSTOP) is input during the capturing operation, a first signal path (the path for the comparison signal CO (=latch startup instruction signal LATSTRT)) that transfers a latch timing signal (the comparison signal CO) that transitions from a low potential to a high potential or from a high potential to a low potential taking a predetermined time, as the latch startup instruction signal LATSTRT, and a second signal path (the path for generating the latch execution instruction signal LATSTOP) that transfers the comparison signal CO as the latch execution instruction signal LATSTOP, the second signal path being different from the first signal path, and a first logic element (the delay circuit 1211) that outputs the delay signal DLYOUT switched to a logical value according to a logical value of an input signal at a first predetermined timing (the timing t3 at which the comparison signal CO is delayed by the predetermined time and inverted), a logical value of the first output signal (the delay signal DLYOUT) being determined according to the logical value of the input signal, and a signal maintenance logic circuit (the RS flip-flop 1212) that continues to output a second output signal (the output signal RSOUT) with a predetermined logical value according to the logical value of the input signal until the logical value is switched to a logical value ("low" level) indicating that a logical value of an input reset signal (the reset signal RST_FF) is initialized are arranged in the path for generating the latch execution instruction signal LATSTOP.

Further, according to the first embodiment, the latch control circuit 12 is configured in which the delay circuit 1211 receives the comparison signal CO as an input signal, and outputs the delay signal DLYOUT switched to a logical value according to the logical value of the comparison signal CO at a timing t3 at which the delay circuit 1211 delays the comparison signal CO by a predetermined time and inverts a resultant signal, and the RS flip-flop 1212 is arranged on a path for generating the latch execution instruction signal LATSTOP on the output side of the delay circuit 1211, and outputs the output signal RSOUT according to the logical value of the delay signal DLYOUT as the latch execution instruction signal LATSTOP.

Further, according to the first embodiment, the latch control circuit 12 that generates the latch driving signal (latch driving signal Hold_L) for driving the latch unit 122 on the basis of the latch startup instruction signal LATSTRT and the latch execution instruction signal LATSTOP is configured.

Further, according to the first embodiment, an AD conversion circuit (the AD conversion circuit 1) is configured in which the AD conversion circuit includes a signal output unit (the comparison unit 11) that compares the potential of the input analog signal (the analog signal Vin) with the potential of the ramp wave (the ramp wave Vramp) that is an analog reference signal of which a potential monotonously decreases or monotonously increases at a constant rate with respect to time, and outputs the comparison signal CO that transitions from a low potential to a high potential or from a high potential to a low potential taking a predetermined time from a time at which the potential of the ramp wave Vramp satisfies a predetermined condition for the potential of the analog signal Vin (a timing at which the potential of the analog signal Vin matches the potential of the ramp wave Vramp), a clock generation circuit (the clock generation circuit that is not shown) that generates the plurality of clock signals (the clock signals CK) with different phases at predetermined regular intervals, the latch control circuit 12 that holds states of phases of the plurality of clock signals CK in the latch unit 122, and outputs phase information (the phase information Lout) indicating the held phase states of the plurality of clock signals CK, and the counting unit (counting unit 13) that outputs a count value (the count value Cout) obtained by counting the number of any one clock signal (the clock signal CKO) among the plurality of clock signals CK, and the digital signal (the digital signal Dout) indicating a magnitude of the input analog signal Vin (the length of the time interval) is output on the basis of the count value Cout and the phase information Lout.

Thus, the AD conversion circuit 1 including the time detection circuit of the first embodiment does not malfunction even when a plurality of different AD conversion circuits 1 operate simultaneously and the power supply voltage or the GND fluctuates in a configuration in which a plurality of AD conversion circuits 1 are simultaneously included (for example, a column ADC type solid-state imaging device). That is, in the time detection circuit of the first embodiment, the length of the time interval indicating the magnitude of the analog signal Vin can be detected normally without there being an influence due to a fluctuation in the power supply voltage or the GND using the configuration of the pulse generation circuit 121 of the latch control circuit 12 (particularly, the configuration in which the RS flip-flop 1212 is included in the path for generating the latch execution instruction signal LATSTOP).

Moreover, the pulse generation circuit 121 operates the latch circuit 1222 in the latch unit 122 constituting the time detection circuit of the first embodiment only in a short period. More specifically, the pulse generation circuit 121 operates the latch circuit 1222 only during a short period from the latch startup instruction signal LATSTRT to the latch execution instruction signal LATSTOP (a short period of a "high" level indicating that the latch driving signal Hold_L is valid (enabled)), and stops the latch circuit 1222 in other periods. Thus, in the AD conversion circuit 1 including the time detection circuit of the first embodiment, it is possible to reduce power consumption when the length of the time interval is detected in a state in which the resolution of the analog-to-digital conversion is maintained. Thus, for example, it is possible to realize low power consumption in a configuration in which a plurality of AD conversion circuits 1 are simultaneously included, such as a column ADC type solid-state imaging device.

In the time detection circuit of the first embodiment shown in FIG. 1, although the configuration in which the RS flip-flop 1212 is included in the pulse generation circuit 121 has been shown, the present invention is not limited to the configuration shown in FIG. 1 as long as a circuit element that performs the same operation as the RS flip-flop 1212 is included. For example, the same operation may be realized in a combination with a flip-flop different from the RS flip-flop 1212 or a circuit element different therefrom.

Further, in the time detection circuit of the first embodiment shown in FIG. 1, the five INV circuits are connected in series to constitute the delay circuit 1211. However, the number of INV circuits included in the delay circuit 1211 is not limited to the configuration shown in FIG. 1 and may be changed, for example, according to a pulse width at a "high" level of the latch driving signal Hold_L required by the latch circuit 1222.

Further, a delay circuit may be included in the path of the comparison signal CO (=latch startup instruction signal LATSTRT) instead of the delay circuit 1211 being included only in the path for generating the latch execution instruction signal LATSTOP. However, to ensure a pulse width of the "high" level of the latch driving signal Hold_L (that is, to ensure a time from the latch startup instruction signal LATSTRT to the latch execution instruction signal LATSTOP), at least, it is necessary to maintain a relationship in which the latch startup instruction signal LATSTRT first comes to a "high" level, and then, the latch execution instruction signal LATSTOP comes to a "low" level in the time detection circuit of the first embodiment.

Second Embodiment

Figure 3:
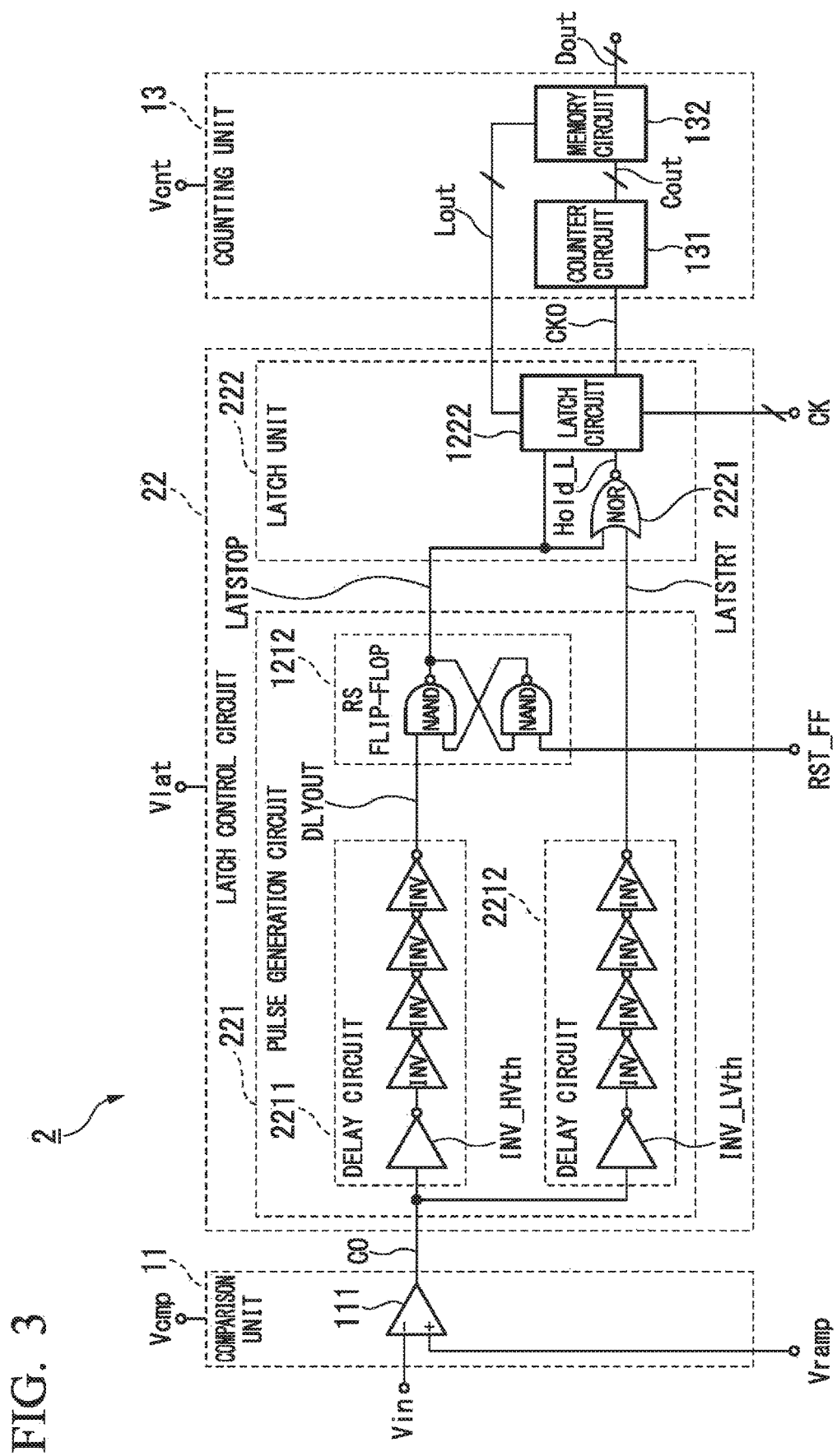
FIG. 3 is a block diagram showing a schematic configuration of an AD conversion circuit including a time detection circuit of a second embodiment of the present invention.

Next, another embodiment of the present invention will be described. FIG. 3 is a block diagram showing a schematic configuration of an AD conversion circuit including a time detection circuit of a second embodiment of the present invention. An AD conversion circuit 2 shown in FIG. 3 includes a comparison unit 11, a latch control circuit 22, and a counting unit 13. In a configuration of the AD conversion circuit 2 shown in FIG. 3, the latch control circuit 22 and the counting unit 13 constitute the time detection circuit of the second embodiment. However, the time detection circuit of the second embodiment may have a configuration in which at least the latch control circuit 22 is included. The time detection circuit of the second embodiment is an example of a configuration in which a delay circuit (=a delay circuit 2212) is included in a path of a latch startup instruction signal LATSTRT.

The components of the AD conversion circuit 2 including the time detection circuit of the second embodiment include the same components as those of the AD conversion circuit 1 including the time detection circuit of the first embodiment. Therefore, among the components of the AD conversion circuit 2 including the time detection circuit of the second embodiment, components the same as those of the AD conversion circuit 1 including the time detection circuit of the first embodiment are denoted with the same reference numerals, and detailed description of these respective components will be omitted. Further, the AD conversion circuit 2 includes the clock generation circuit that outputs a plurality of clock signals CK with different phases at regular intervals, but the clock generation circuit is not shown in FIG. 3. The time detection circuit of the second embodiment may include the clock generation circuit (not shown) as a component.

The comparison unit 11 outputs the comparison signal CO output by the comparator 111 to the latch control circuit 22. In the AD conversion circuit 2, a period from a timing of start of the analog-to-digital conversion to a time of inversion of the logic of the comparison signal CO is the length of the time interval indicating the magnitude of the analog signal Vin.

The latch control circuit 22 includes a pulse generation circuit 221, and a latch unit 222. The pulse generation circuit 221 includes a delay circuit 2211, a delay circuit 2212, and an RS flip-flop 1212. Further, the latch unit 222 includes a negative logical sum circuit (hereinafter referred to as a "NOR circuit") 2221, and a latch circuit 1222. Each component of the latch control circuit 22 operates with the power supply voltage Vlat.

The pulse generation circuit 221 generates a control signal (latch startup instruction signal LATSTRT and latch execution instruction signal LATSTOP) for controlling a timing at which the latch unit 222 holds (latches) a logic state (phase state) of the plurality of clock signals CK with different phases output from the clock generation circuit (not shown) on the basis of the comparison signal CO input from the comparison unit 11, and outputs the control signal to the latch unit 222.

The delay circuit 2211 outputs a delay signal DLYOUT obtained by delaying the comparison signal CO input from the comparison unit 11 by a predetermined time and inverting a resultant signal, to the RS flip-flop 1212. The delay circuit 2211 includes one INV circuit INV_HVth of which the input threshold voltage Vth for determining that the comparison signal CO is at a "high" level is high. As shown in FIG. 3, in the configuration of the delay circuit 2211 in which the five INV circuits are connected in series, the first (initial stage) INV circuit is the INV circuit INV_HVth for a high input threshold voltage Vth. A position at which the INV circuit INV_HVth is arranged in the delay circuit 2211 (that is, a stage in which the INV circuit INV_HVth is arranged) is not defined.

The delay circuit 2212 outputs the delay signal obtained by delaying the comparison signal CO input from the comparison unit 11 by a predetermined time and inverting a resultant signal, similar to the delay circuit 2211. The delay circuit 2212 includes one INV circuit INV_LVth of which the input threshold voltage Vth for determining that the comparison signal CO is at a "high" level is low. As shown in FIG. 3, in the configuration of the delay circuit 2212 in which the five INV circuits are connected in series, the first (initial stage) INV circuit is the INV circuit INV_LVth for a low input threshold voltage Vth. The delay circuit 2212 outputs the delay signal obtained by delaying and inverting the comparison signal CO to the latch unit 222 as the latch startup instruction signal LATSTRT. A position at which the INV circuit INV_HVth is arranged in the delay circuit 2212 (that is, a stage in which the INV circuit INV_LVth is arranged) is not defined.

In the pulse generation circuit 221, the respective delay signals generated from the same comparison signal CO are caused to have a time difference according to a difference in the respective input threshold voltages Vth in the INV circuit INV_HVth included in the delay circuit 2211 and the INV circuit INV_LVth included in the delay circuit 2212.

The RS flip-flop 1212 holds the logic of the delay signal DLYOUT output from the delay circuit 2211, and outputs an output signal RSOUT indicating the held logic of the delay signal DLYOUT to the latch unit 222 as the latch execution instruction signal LATSTOP.

The latch unit 222 captures and holds (latches) the phase state of the plurality of clock signals CK with different phases output from the clock generation circuit (not shown) according to a control signal (the latch startup instruction signal LATSTRT and the latch execution instruction signal LATSTOP) output from the pulse generation circuit 221.

The NOR circuit 2221 performs negative logical sum of the latch startup instruction signal LATSTRT and the latch execution instruction signal LATSTOP output from the pulse generation circuit 221 to generate the latch driving signal Hold_L indicating a period in which the latch circuit 1222 operates. The latch driving signal Hold_L is a signal that indicates that an operation of the latch circuit 1222 is valid (enabled) when the latch startup instruction signal LATSTRT is at a "low" level and the latch execution instruction signal LATSTOP is at a "low" level, and then, invalidates (disables) the operation of the latch circuit 1222 when the latch execution instruction signal LATSTOP then comes to a "high" level to hold (latch) a current phase state of the clock signal CK. The NOR circuit 2221 outputs the generated latch driving signal Hold_L to the latch circuit 1222.

The latch circuit 1222 captures and holds (latches) the phase state of the corresponding clock signal CK in response to the latch driving signal Hold_L output from the NOR circuit 2221, and outputs phase information Lout indicating the held (latched) phase state of each clock signal CK to the counting unit 13. Further, the latch circuit 1222 outputs the clock signal CK0 to the counting unit 13 during a period in which the latch execution instruction signal LATSTOP output from the pulse generation circuit 221 indicates the output of the clock signal CK.

A configuration and an operation of the latch circuit 1222 are the same as those of the latch circuit 1222 included in the time detection circuit of the first embodiment, and those of the latch unit 832 included in the AD conversion circuit 8 of the related art shown in FIG. 8. Further, a configuration and an operation of the counting unit 13 are the same as those of the counting unit 13 included in the time detection circuit of the first embodiment. Therefore, a detailed description of the components and the operations of the latch circuit 1222 and the counting unit 13 will be omitted.

Next, an operation of the AD conversion circuit 2 will be described. A normal operation in the AD conversion circuit 2 is the same as that of the AD conversion circuit 1 including the time detection circuit of the first embodiment, and the AD conversion circuit 8 of the related art shown in FIG. 9. Accordingly, a detailed description of the normal operation of the AD conversion circuit 2 will be omitted. In the following description, an operation of the AD conversion circuit 2 in a case in which the power supply voltage or the GND fluctuates due to a simultaneous operation of a plurality of different AD conversion circuits 2 in a configuration in which a plurality of AD conversion circuits 2 are simultaneously included (for example, a column ADC type solid-state imaging device) will be described. That is, in the following description, an operation of the AD conversion circuit 2 in a situation in which the AD conversion circuit 8 of the related art malfunctions (see FIG. 10) due to the fluctuation in the power supply voltage or the GND will be described.

Figure 4:
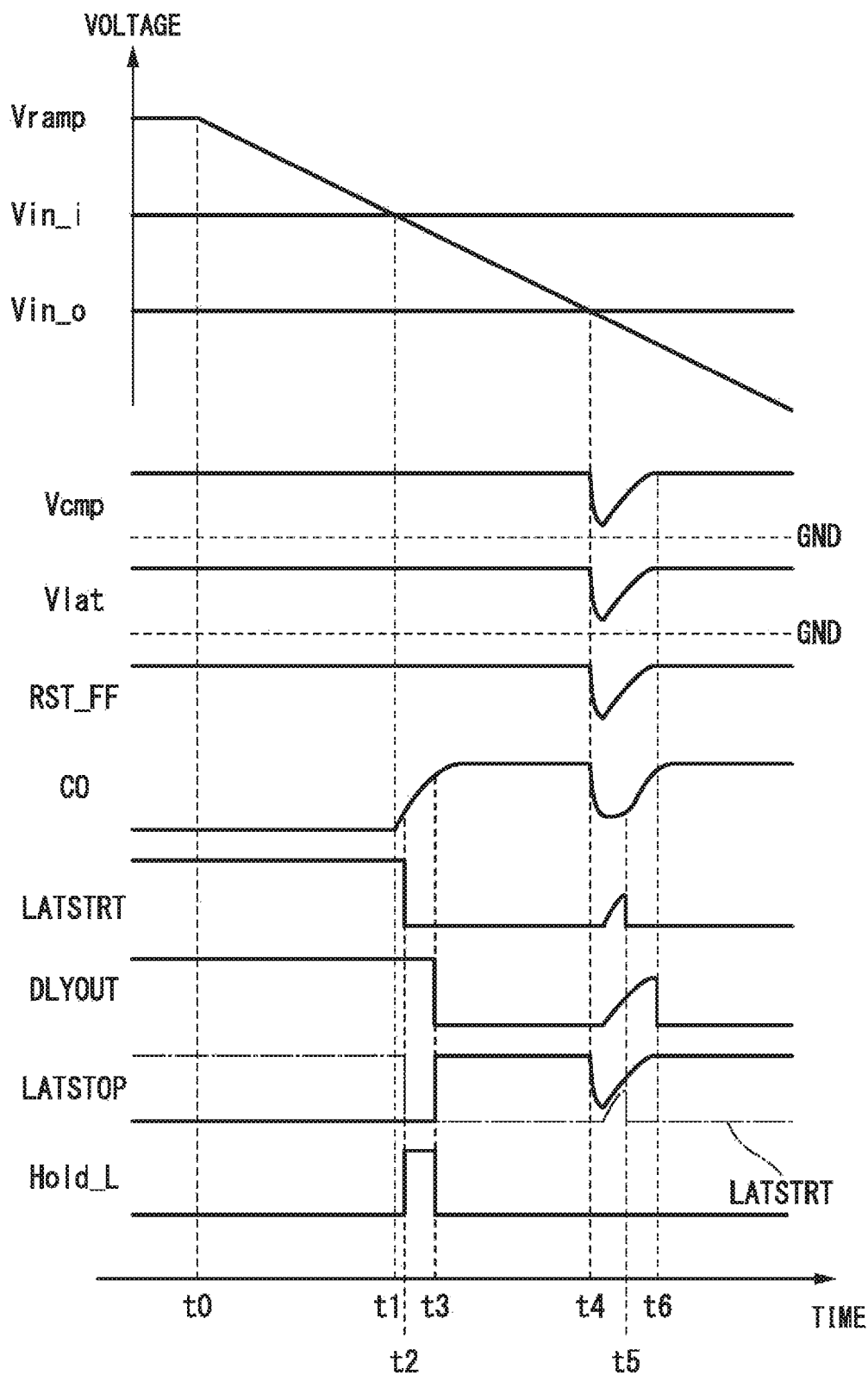
FIG. 4 is a timing chart showing an example of an operation in the time detection circuit of the second embodiment of the present invention.

FIG. 4 is a timing chart showing an example of an operation in the time detection circuit of the second embodiment of the present invention. The timing chart shown in FIG. 4 indicates an example of operation timings in a case in which the analog signal Vin_i is input to any one of AD conversion circuits 2 and the analog signal Vin_o is input to the plurality of other AD conversion circuits 2 in a configuration in which the plurality of AD conversion circuits 2 are simultaneously included, such as in a column ADC type solid-state imaging device, as in the operation of the AD conversion circuit 1 including the time detection circuit in the first embodiment shown in FIG. 2. In the following description, any one of the AD conversion circuits 2 to which the analog signal Vin_i has been input is referred to as an "AD conversion circuit 2*i*", and the plurality of other AD conversion circuits 2 to which the analog signal Vin_o has been input is referred to as an "AD conversion circuit 2*o*". In FIG. 4, only timings of respective signals in the latch control circuit 22 that is a component of the time detection circuit of the second embodiment included in the AD conversion circuit 2*i* are shown, as in the operation of the AD conversion circuit 1 including the time detection circuit in the first embodiment shown in FIG. 2.

First, from a timing t0, each AD conversion circuit 2 starts analog-to-digital conversion. Here, the comparator 111 in the comparison unit 11 of the AD conversion circuit 2*i* performs comparison of the potential of the analog signal Vin_i with the potential of the ramp wave Vramp, and the comparator 111 in the comparison unit 11 of the AD conversion circuit 2*o* performs comparison of the potential of the analog signal Vin_o with the potential of the ramp wave Vramp.

Then, from a timing t1 at which the potential of the analog signal Vin_i and the potential of the ramp wave Vramp match, the comparator 111 in the comparison unit 11 of the AD conversion circuit 2*i* starts inversion of logic of the comparison signal CO. From a timing t2 at which the level of the comparison signal CO comes to the low input threshold voltage Vth of the INV circuit INV_LVth in the delay circuit 2212, the respective INV circuits in the delay circuit 2212 sequentially invert the comparison signal CO and the latch startup instruction signal LATSTRT comes to the "low" level. Accordingly, the NOR circuit 2221 in the latch unit 222 causes the latch driving signal Hold_L to comes to a "high" level. Accordingly, the latch circuit 1222 in the latch unit 222 of the AD conversion circuit 2*i* starts the operation of capturing the phase state of the clock signal CK.

Further, from a timing t3 at which the level of the comparison signal CO comes to the high input threshold voltage Vth of the INV circuit INV_HVth in the delay circuit 2211, the respective INV circuits in the delay circuit 2211 sequentially invert the comparison signal CO and the delay signal DLYOUT comes to a "low" level. Accordingly, the latch execution instruction signal LATSTOP output by the RS flip-flop 1212 comes to a "high" level. Accordingly, the latch driving signal Hold_L output by the NOR circuit 2221 comes to a "low" level.

Accordingly, the latch circuit 1222 in the latch unit 222 of the AD conversion circuit 2*i* holds (latches) the phase state of the clock signal CK. This operation of the AD conversion circuit 2*i* is a normal operation.

Then, at a timing t4 at which the potential of the analog signal Vin_o and the potential of the ramp wave Vramp match, the AD conversion circuit 2*o* operates simultaneously. Accordingly, the potentials of the power supply voltage Vcmp and the power supply voltage Vlat of the AD conversion circuit 2*i* may decrease to near a level of GND.

In this case, with the decrease in the potentials of the power supply voltage Vcmp and the power supply voltage Vlat, the level of the comparison signal CO output by the comparator 111 in the comparison unit 11 of the AD conversion circuit 2*i* and the latch execution instruction signal LATSTOP output by the RS flip-flop 1212 in the pulse generation circuit 221 also decreases.

Thereafter, the potentials of the power supply voltage Vcmp and the power supply voltage Vlat of the AD conversion circuit 2*i* begin to return to their original state. Accordingly, the comparison signal CO output by the comparator 111 in the comparison unit 11 of the AD conversion circuit 2*i* returns to a "high" level with the return of the potentials of the power supply voltage Vcmp and the power supply voltage Vlat.

Here, a case in which characteristics of the response speed of the comparator 111 are the same as those of the AD conversion circuit 8 of the related art shown in FIG. 10 is conceivable. More specifically, a case in which a timing of return of the comparison signal CO to a "high" level is later than a timing at which the potential of the power supply voltage Vcmp returns is conceivable.

First, an operation of the delay circuit 2211 and the delay circuit 2212 during return of the potentials of the power supply voltage Vcmp and the power supply voltage Vlat will be described. The INV circuit INV_LVth in the delay circuit 2212 operates to output a "high" level as the level of the comparison signal CO decreases to a low level ("low" level). However, the INV circuit INV_LVth cannot output a "high" level since the potential of the power supply voltage Vlat decreases, and outputs a "high" level at a timing at which the potential of the power supply voltage Vlat returns. Accordingly, the latch startup instruction signal LATSTRT also comes to a "high" level at the timing at which the potential of the power supply voltage Vlat returns. The delay circuit 2212 causes the latch startup instruction signal LATSTRT to return to the "low" level at a timing t5 at which the level of the comparison signal CO comes to the low input threshold voltage Vth of the INV circuit INV_LVth.

Further, the INV circuit INV_HVth in the delay circuit 2211 operates to output a "high" level as the level of the comparison signal CO decreases to a low level ("low" level). However, the INV circuit INV_HVth cannot output a "high" level since the potential of the power supply voltage Vlat decreases, similar to the INV circuit INV_LVth in the delay circuit 2212, and outputs a "high" level at a timing at which the potential of the power supply voltage Vlat returns. Accordingly, the delay signal DLYOUT also comes to a "high" level at the timing at which the potential of the power supply voltage Vlat returns. The delay circuit 2211 causes the delay signal DLYOUT to return to the "low" level at a timing t6 at which the level of the comparison signal CO comes to the high input threshold voltage Vth of the INV circuit INV_HVth. Further, as can be seen from FIG. 4, in the pulse generation circuit 221, the delay signal DLYOUT output by the delay circuit 2211 increases to a level higher than that of the latch startup instruction signal LATSTRT according to the timing at which the potential of the power supply voltage Vlat returns, due to a difference between the respective input threshold voltages Vth of the INV circuit INV_HVth included in the delay circuit 2211 and the INV circuit INV_LVth included in the delay circuit 2212.

Next, an operation of the components in the RS flip-flop 1212 during return of the potentials of the power supply voltage Vcmp and the power supply voltage Vlat will be described. The NAND circuit that outputs the latch execution instruction signal LATSTOP, which constitutes the RS flip-flop 1212, outputs a "high" level, but the latch execution instruction signal LATSTOP decreases to near the level of GND due to the decrease in the potential of the power supply voltage Vlat. In this case, the NAND circuit to which the reset signal RST_FF has been input outputs a "low" level, but operates to output a "high" level as the level of the latch execution instruction signal LATSTOP decreases to a low level ("low" level). However, the NAND circuit to which the reset signal RST_FF has been input cannot output a "high" level as the potential of the power supply voltage Vlat decreases, and the output thereof remains at a "Low" level and does not change. Therefore, the NAND circuit that outputs the latch execution instruction signal LATSTOP operates to output a "high" level due to the output of the NAND circuit to which the reset signal RST_FF has been input, and returns to a "high" level at the timing at which the potential of the power supply voltage Vlat returns. Therefore, a timing at which the latch execution instruction signal LATSTOP output by the RS flip-flop 1212 returns to a "high" level is not later than the timing at which the potential of the power supply voltage Vcmp and the power supply voltage Vlat returns. In FIG. 4, a waveform of the latch startup instruction signal LATSTRT output by the delay circuit 2212 is indicated by a dash-dotted line according to a waveform of the latch execution instruction signal LATSTOP.

Since a change in the delay signal DLYOUT output by the delay circuit 2211 in the pulse generation circuit 221 is at the same timing as that at which the potential of the power supply voltage Vlat returns as described above, the change does not influence the latch execution instruction signal LATSTOP output by the RS flip-flop 1212. That is, when the delay signal DLYOUT comes to a "low" level at a timing t6, the latch execution instruction signal LATSTOP output by the RS flip-flop 1212 comes to a "high" level.

Accordingly, the NOR circuit 2221 in the latch unit 222 continues to output the latch driving signal Hold_L at a "low" level without causing the latch driving signal Hold_L to come to a "high" level using the latch startup instruction signal LATSTRT or the latch execution instruction signal LATSTOP during return of the potential of the power supply voltage Vlat.

Accordingly, even when the potentials of the power supply voltage Vcmp and the power supply voltage Vlat of the AD conversion circuit 2*i* fluctuate, the latch circuit 1222 in the latch unit 222 of the AD conversion circuit 2*i* does not hold (latch) the phase state of the clock signal CK at this time. That is, the AD conversion circuit 2*i* does not malfunction due to the fluctuation in potentials of the power supply voltage Vcmp and the power supply voltage Vlat, which occurs between the timing t4 and the timing t6 due to a simultaneous operation of the AD conversion circuit 2*o*.

According to the second embodiment, the time detection circuit (at least the latch control circuit 22) is configured in which the second logic element (delay circuit 2212) that outputs a delay signal switched to a logical value according to the logical value of the input signal at a second predetermined timing (a timing t2 at which the level of the comparison signal CO comes to a low input threshold voltage Vth) different from the first timing (a timing t3 at which the level of the comparison signal CO comes to a high input threshold voltage Vth), the logical value of the third output signal (delay signal) being determined according to the logical value of the input signal, is arranged in the path of the comparison signal CO (=latch startup instruction signal LATSTRT), and the timing t2 at which the level of the comparison signal CO comes to the low input threshold voltage Vth is a timing at which a logical value of the delay signal is switched before a timing at which a logical value of the first output signal (the delay signal DLYOUT) is switched when the same signal is simultaneously input as an input signal of the first logic element (delay circuit 2211) and the delay circuit 2212.

Further, according to the second embodiment, the latch control circuit 22 is configured in which the delay circuit 2211 outputs the delay signal DLYOUT switched to the logical value according to the logical value of the comparison signal CO at a timing at which the potential of the comparison signal CO input as an input signal crosses the first predetermined threshold value (high input threshold voltage Vth), the delay circuit 2212 outputs the delay signal switched to the logical value according to the logical value of the comparison signal CO at a timing at which the potential of the comparison signal CO input as an input signal crosses the second predetermined threshold value (low input threshold voltage Vth) different from the predetermined high input threshold value Vth, and the low input threshold voltage Vth is a threshold value to which the logical value of the delay signal is switched at a timing before the timing at which the logical value of the delay signal DLYOUT is switched when the same comparison signal CO is simultaneously input as the input signal of the delay circuit 2211 and the delay circuit 2212.

Thus, the AD conversion circuit 2 including the time detection circuit of the second embodiment does not malfunction even when a plurality of different AD conversion circuits 2 operate simultaneously and the power supply voltage or the GND fluctuates in a configuration in which the plurality of AD conversion circuits 2 are simultaneously included (for example, a column ADC type solid-state imaging device), similar to the AD conversion circuit 1 including the time detection circuit of the first embodiment. That is, in the time detection circuit of the second embodiment, the length of the time interval indicating the magnitude of the analog signal Vin can be detected normally without there being an influence due to a fluctuation in the power supply voltage or the GND using the configuration of the pulse generation circuit 221 in the latch control circuit 22 (particularly, the configuration in which the RS flip-flop 1212 is included in the path for generating the latch execution instruction signal LATSTOP).

Moreover, the pulse generation circuit 221 operates the latch circuit 1222 in the latch unit 222 only in a short period from the latch startup instruction signal LATSTRT to the latch execution instruction signal LATSTOP, and stops the latch circuit 1222 in the latch unit 222 in other periods of time, similar to the AD conversion circuit 1 including the time detection circuit of the first embodiment. Thus, in the AD conversion circuit 2 including the time detection circuit of the second embodiment, it is possible to achieve the same effects as those in the AD conversion circuit 1 including the time detection circuit of the first embodiment. That is, it is possible to realize low power consumption while maintaining the resolution of the analog-to-digital conversion.

Although the configuration in which the RS flip-flop 1212 is included in the pulse generation circuit 221 has been shown in the time detection circuit of the second embodiment shown in FIG. 3, the same operation may be realized in a combination of a different flip-flop or a different circuit element as long as the circuit element performs the same operation as that of the RS flip-flop 1212, similar to the time detection circuit of the first embodiment.

Further, the number of INV circuits constituting the respective delay circuits in the time detection circuit of the second embodiment shown in FIG. 3 is also not limited to the configuration shown in FIG. 3. In the time detection circuit of the second embodiment, in order to ensure the pulse width of the "high" level of the latch driving signal Hold_L (that is, in order to secure the time from the latch startup instruction signal LATSTRT to the latch execution instruction signal LATSTOP), it is necessary, at least, for the INV circuit INV_HVth with a high input threshold voltage Vth to be included in the delay circuit 2211, and the INV circuit INV_LVth with a low input threshold voltage Vth to be included in the delay circuit 2212.

Further, in the time detection circuit of the second embodiment shown in FIG. 3, the case in which the respective delay signals generated from the same comparison signal CO are caused to have a time difference according to a difference between the input threshold voltages Vth of any INV circuits included in the respective delay circuits has been described. However, a method of causing the respective delay signals to have the time difference is not limited to the method described in the second embodiment. For example, the respective delay signals can be caused to have the time difference by setting the number (stages) of INV circuits included in the delay circuit to a different number (the number of stages) in the respective delay circuits. In this case, by causing the number (the number of stages) of INV circuits included in the delay circuit 2211 to be larger than the number (the number of stages) of INV circuits included in the delay circuit 2212, it is possible to ensure the time from the latch startup instruction signal LATSTRT to the latch execution instruction signal LATSTOP (that is, the pulse width of the "high" level of the latch driving signal Hold_L).

In the configuration of the time detection circuit of the first embodiment shown in FIG. 1, and the time detection circuit of the second embodiment shown in FIG. 3, the configuration in which the RS flip-flop 1212 is arranged in a stage subsequent to the delay circuit has been shown. However, the arrangement of the RS flip-flop 1212 is not limited to the arrangement shown in FIGS. 1 and 2, and the RS flip-flop 1212 may also be arranged in a stage before the delay circuit.

Third Embodiment

Figure 5:
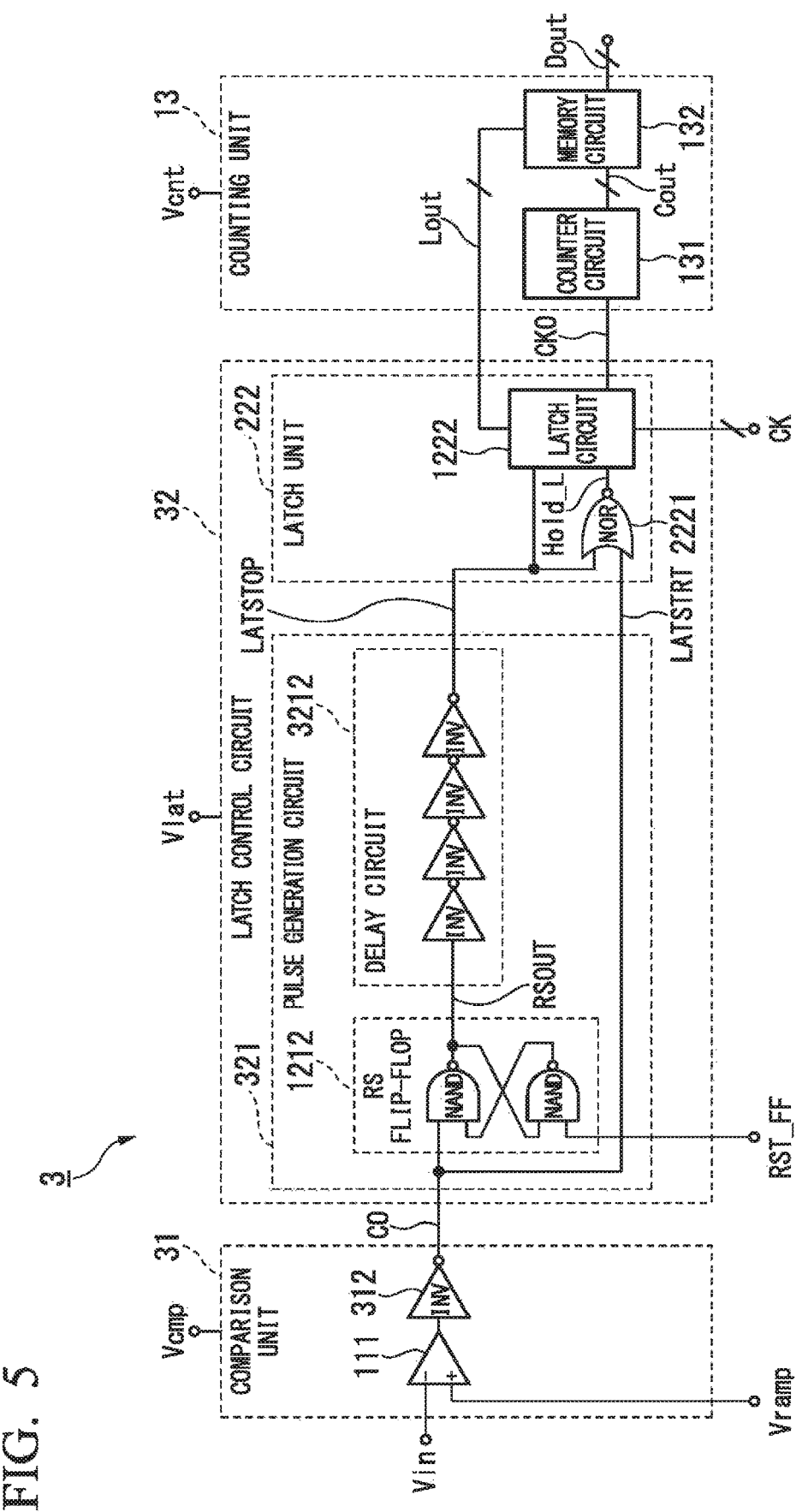
FIG. 5 is a block diagram showing a schematic configuration of an AD conversion circuit including a time detection circuit of a third embodiment of the present invention.

Next, still another embodiment of the present invention will be described. FIG. 5 is a block diagram showing a schematic configuration of an AD conversion circuit including a time detection circuit of a third embodiment of the present invention. An AD conversion circuit 3 shown in FIG. 5 includes a comparison unit 31, a latch control circuit 32, and a counting unit 13. In the configuration of the AD conversion circuit 3 shown in FIG. 5, the latch control circuit 32 and the counting unit 13 constitute the time detection circuit of the third embodiment. However, the time detection circuit of the third embodiment may have a configuration in which at least the latch control circuit 32 is included. The time detection circuit of the third embodiment is an example of a configuration in which the RS flip-flop is arranged in a stage before the delay circuit.

The components of the AD conversion circuit 3 including the time detection circuit of the third embodiment include the same components as those of the AD conversion circuit 1 including the time detection circuit of the first embodiment or the AD conversion circuit 2 including the time detection circuit of the second embodiment. Therefore, among the components of the AD conversion circuit 3 including the time detection circuit of the third embodiment, the same components as those of the AD conversion circuit including the time detection circuit of the first or second embodiment are denoted with the same reference numerals, and a detailed description of these respective components will be omitted. Further, the AD conversion circuit 3 includes the clock generation circuit that outputs a plurality of clock signals CK with different phases at regular intervals, but the clock generation circuit is not shown in FIG. 5. The time detection circuit of the third embodiment may include the clock generation circuit (not shown) as a component.

The comparison unit 31 includes a comparator 111 and an INV circuit 312. The comparison unit 31 inverts an output signal output by the comparator 111 using the INV circuit 312, and outputs a resultant signal to the latch control circuit 32 as a comparison signal CO. In the AD conversion circuit 3, a period from a timing of start of the analog-to-digital conversion to a time of inversion of the logic of the comparison signal CO is the length of the time interval indicating the magnitude of the analog signal Vin. Each component in the comparison unit 31 operates with a power supply voltage Vcmp.

The latch control circuit 32 includes a pulse generation circuit 321, and a latch unit 222. The pulse generation circuit 321 includes an RS flip-flop 1212, and a delay circuit 3212. Further, the latch unit 222 includes a NOR circuit 2221, and a latch circuit 1222. Each component of the latch control circuit 32 operates with the power supply voltage Vlat.

The pulse generation circuit 321 generates a control signal (latch startup instruction signal LATSTRT and latch execution instruction signal LATSTOP) for controlling a timing at which the latch unit 222 holds (latches) a logic state (phase state) of the plurality of clock signals CK with different phases output from the clock generation circuit (not shown) on the basis of the comparison signal CO input from the comparison unit 31, and outputs the control signal to the latch unit 222.

The RS flip-flop 1212 holds the logic of the comparison signal CO input from the comparison unit 31, and outputs the output signal RSOUT indicating the held logic of the comparison signal CO to the delay circuit 3212.

As described above, in the pulse generation circuit 321, the RS flip-flop 1212 is arranged before the delay circuit 3212 (that is, the side on which the comparison signal CO is input), unlike the pulse generation circuit including the time detection circuit of the first or second embodiment. With this arrangement, the INV circuit 312 is added in the comparison unit 31. This is because the RS flip-flop 1212 is a flip-flop including a NAND circuit that responds to a "low" level (falling) of the input signal (=the comparison signal CO). Thus, according to the configuration of the RS flip-flop 1212, the INV circuit 312 is not included in the comparison unit 31.

The delay circuit 3212 outputs a delay signal obtained by delaying the output signal RSOUT input from the RS flip-flop 1212 by a predetermined time and inverting a resultant signal. The delay circuit 3212 outputs the delay signal obtained by delaying and inverting the output signal RSOUT to the latch unit 222 as the latch execution instruction signal LATSTOP. In FIG. 5, a configuration of the delay circuit 3212 in which four INV circuits are connected in series is shown.

The latch unit 222 captures and holds (latches) the phase state of the plurality of clock signals CK with different phases output from the clock generation circuit (not shown) according to a control signal (the latch startup instruction signal LATSTRT and the latch execution instruction signal LATSTOP) output from the pulse generation circuit 321.

A configuration and an operation of the latch unit 222 and the counting unit 13 are the same as those of the time detection circuit of the second embodiment. Therefore, a detailed description of components and the operations of the latch unit 222 and the counting unit 13 will be omitted.

Next, an operation of the AD conversion circuit 3 will be described. A normal operation in the AD conversion circuit 3 is the same as that of the AD conversion circuit including the time detection circuit of the first or second embodiment, and the AD conversion circuit 8 of the related art shown in FIG. 9. Accordingly, a detailed description of the normal operation of the AD conversion circuit 3 will be omitted. In the following description, an operation of the AD conversion circuit 3 in a case in which the power supply voltage or the GND fluctuates due to a simultaneous operation of a plurality of different AD conversion circuits 3 in a configuration in which a plurality of AD conversion circuits 3 are simultaneously included (for example, a column ADC type solid-state imaging device), as in the first and second embodiments, will be described. That is, in the following description, an operation of the AD conversion circuit 3 in a situation in which the AD conversion circuit 8 of the related art malfunctions (see FIG. 10) due to the fluctuation in the power supply voltage or the GND will be described.

Figure 6:
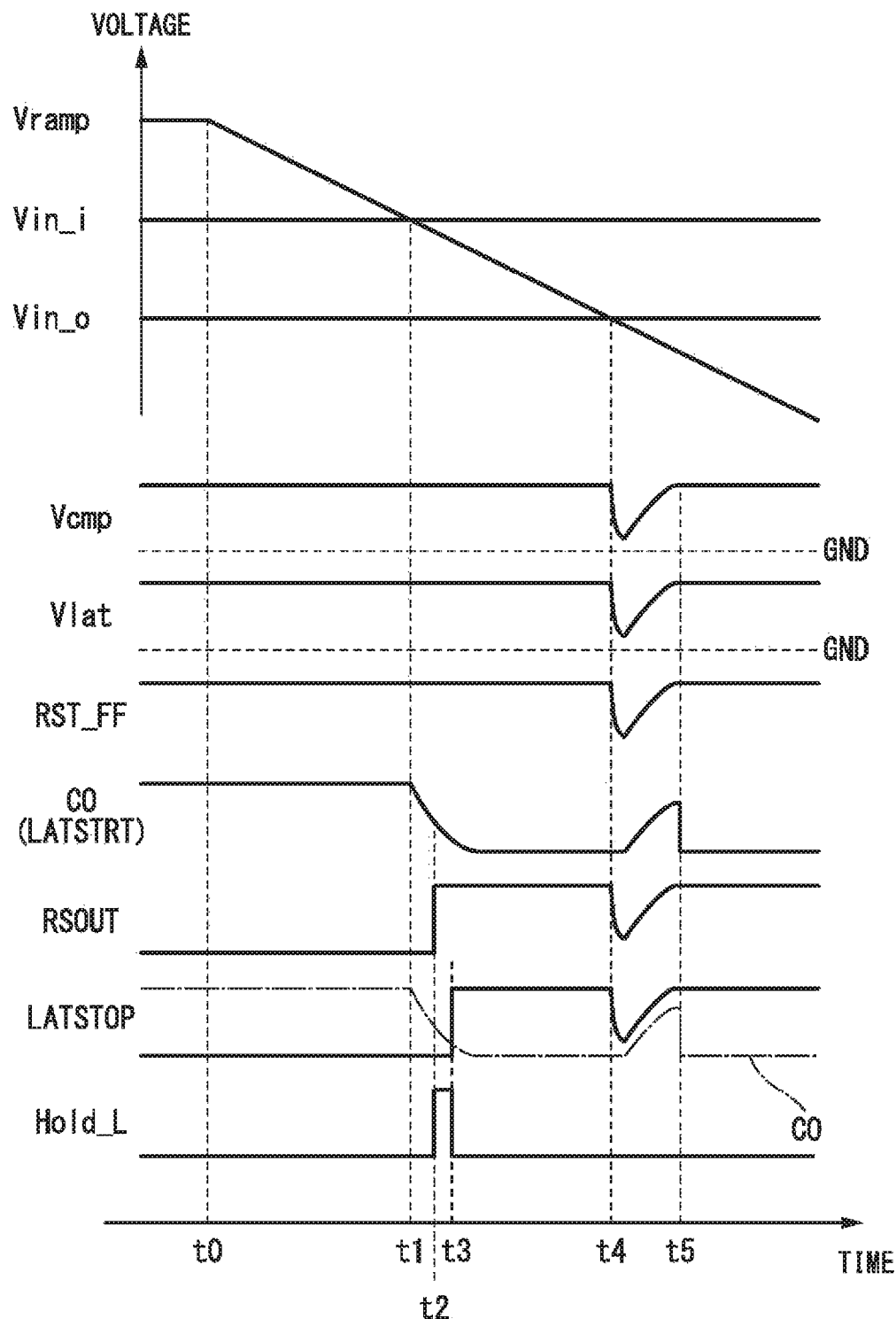
FIG. 6 is a timing chart showing an example of an operation in the time detection circuit of the third embodiment of the present invention.

FIG. 6 is a timing chart showing an example of an operation in the time detection circuit of the third embodiment of the present invention. The timing chart shown in FIG. 6 indicates an example of operation timings in a case in which a plurality of AD conversion circuits 3 are simultaneously included, as in a column ADC type solid-state imaging device, the analog signal Vin_i is input to any one of the AD conversion circuits 3 and the analog signal Vin_o is input to a plurality of other AD conversion circuits 3, as in the operation in the AD conversion circuit including the time detection circuit of the first embodiment shown in FIG. 2 and the second embodiment shown in FIG. 4. In the following description, any one of the AD conversion circuits 3 to which the analog signal Vin_i has been input is referred to as an "AD conversion circuit 3*i*", and the plurality of other AD conversion circuits 3 to which the analog signal Vin_o has been input are referred to as "AD conversion circuits 3*o*". In FIG. 6, only timings of respective signals in the latch control circuit 32 that is a component of the time detection circuit of the third embodiment included in the AD conversion circuit 3*i* are shown, as in the operation of the AD conversion circuit including the time detection circuit of the first embodiment shown in FIG. 2 and the second embodiment shown in FIG. 4.

First, from a timing t0, each AD conversion circuit 3 starts analog-to-digital conversion. Here, the comparator 111 in the comparison unit 31 of the AD conversion circuit 3*i* performs comparison of the potential of the analog signal Vin_i with the potential of the ramp wave Vramp, and the comparator 111 in the comparison unit 31 of the AD conversion circuit 3*o* performs comparison of the potential of the analog signal Vin_o with the potential of the ramp wave Vramp.

Then, from a timing t1 at which the potential of the analog signal Vin_i and the potential of the ramp wave Vramp match, the comparator 111 in the comparison unit 31 of the AD conversion circuit 3*i* starts inversion of logic of the output signal, and the INV circuit 312 inverts the logic of the output signal and outputs a resultant signal as a comparison signal CO. At a timing t2 at which the level of the comparison signal CO (that is, the latch startup instruction signal LATSTRT) comes to an input threshold voltage of the NOR circuit 2221 in the latch unit 222, the latch driving signal Hold_L comes to a "high" level. Accordingly, the latch circuit 1222 in the latch unit 222 of the AD conversion circuit 3*i* starts the operation of capturing the phase state of the clock signal CK.

Further, at a timing t2 at which the level of the comparison signal CO comes to the input threshold voltage of the RS flip-flop 1212, the output signal RSOUT comes to a "high" level. From the timing t2, the INV circuit included in the delay circuit 3212 of the pulse generation circuit 321 sequentially inverts the output signal RSOUT to delay the output signal RSOUT by a predetermined time and inverts a resultant signal. At a timing t3, the latch execution instruction signal LATSTOP transitions to a "high" level. Accordingly, the latch driving signal Hold_L output by the NOR circuit 2221 comes to a "low" level.

Accordingly, the latch circuit 1222 in the latch unit 222 of the AD conversion circuit 3*i* holds (latches) the phase state of the clock signal CK. This operation of the AD conversion circuit 3*i* is a normal operation.

Then, at a timing t4 at which the potential of the analog signal Vin_o and the potential of the ramp wave Vramp match, the AD conversion circuit 3*o* operates simultaneously. Accordingly, the potentials of the power supply voltage Vcmp and the power supply voltage Vlat of the AD conversion circuit 3*i* may decrease to near a level of GND. In this case, with the decrease in the potentials of the power supply voltage Vcmp and the power supply voltage Vlat, the level of the output signal RSOUT output by the RS flip-flop 1212 in the pulse generation circuit 321 and the latch execution instruction signal LATSTOP output by the delay circuit 3212 also decreases.

Thereafter, the potentials of the power supply voltage Vcmp and the power supply voltage Vlat of the AD conversion circuit 3*i* begin to return to their original state. Accordingly, the output signal RSOUT and the latch execution instruction signal LATSTOP also returns to a "high" level with the return of the potentials of the power supply voltage Vcmp and the power supply voltage Vlat.

Here, a case in which characteristics of the response speed of the comparator 111 are the same as those of the AD conversion circuit 8 of the related art shown in FIG. 10 is conceivable. More specifically, a case in which a timing of return of the output signal output by the comparator 111 in the comparison unit 31 to a "high" level is later than a timing at which the potential of the power supply voltage Vcmp returns is conceivable. More particularly, since the return to the "high" level of the output signal output by the comparator 111 in the comparison unit 31 is later, the case in which the INV circuit 312 in the comparison unit 31 outputs the same high level ("high" level) as that of the potential of the power supply voltage Vcmp during the return of the potential according to a timing at which the output signal returns to the "high" level, and return to the "low" level occurs at the timing t5 is conceivable.

First, an operation of the components in the RS flip-flop 1212 during return of the potentials of the power supply voltage Vcmp and the power supply voltage Vlat will be described. The NAND circuit to which the reset signal RST_FF has been input, which constitutes the RS flip-flop 1212, outputs a "low" level, but operates to output a "high" level as the level of the output signal RSOUT decreases to a low level ("low" level). However, the NAND circuit to which the reset signal RST_FF has been input cannot output a "high" level as the potential of the power supply voltage Vlat decreases, and the output thereof remains at a "Low" level and does not change. Therefore, the NAND circuit that outputs the output signal RSOUT operates to output a "high" level due to the output of the NAND circuit to which the reset signal RST_FF has been input, and returns to a "high" level at the timing at which the potential of the power supply voltage Vlat returns. Therefore, a timing at which the output signal RSOUT output by the RS flip-flop 1212 returns to a "high" level is not later than the timing at which the potential of the power supply voltage Vcmp and the power supply voltage Vlat returns.

Next, an operation of the delay circuit 3212 during return of the potentials of the power supply voltage Vcmp and the power supply voltage Vlat will be described. Although the delay circuit 3212 outputs a "high" level, the "high" level cannot be output since the potential of the power supply voltage Vlat decreases, and the output returns to a "high" level at a timing at which the potential of the power supply voltage Vlat returns. Therefore, a timing at which the latch execution instruction signal LATSTOP output by the delay circuit 3212 returns to a "high" level is not later than the timing at which the potential of the power supply voltage Vcmp or the power supply voltage Vlat returns. In FIG. 6, a waveform of the comparison signal CO (=latch startup instruction signal LATSTRT) output by the INV circuit 312 in the comparison unit 31 is indicated by a dash-dotted line according to a waveform of the latch execution instruction signal LATSTOP.

Accordingly, the NOR circuit 2221 in the latch unit 222 continues to output the latch driving signal Hold_L at a "low" level without causing the latch driving signal Hold_L to come to a "high" level using the latch startup instruction signal LATSTRT or the latch execution instruction signal LATSTOP during return of the potential of the power supply voltage Vlat.

Accordingly, even when the potentials of the power supply voltage Vcmp and the power supply voltage Vlat of the AD conversion circuit 3*i* fluctuate, the latch circuit 1222 in the latch unit 222 of the AD conversion circuit 3*i* does not hold (latch) the phase state of the clock signal CK at this time. That is, the AD conversion circuit 3*i* does not malfunction due to the fluctuation in potentials of the power supply voltage Vcmp and the power supply voltage Vlat, which occurs between the timing t4 and the timing t5 due to a simultaneous operation of the AD conversion circuit 3.

According to the third embodiment, the time detection circuit (at least, the latch control circuit 32) is configured in which the signal maintenance logic circuit (the RS flip-flop 1212) receives the comparison signal CO as an input signal and outputs the second output signal (output signal RSOUT) according to the logical value of the comparison signal CO, and the first logic element (the delay circuit 3212) is arranged on the second signal path on the output side of the RS flip-flop 1212 (the path for generating the latch execution instruction signal LATSTOP), and outputs the first output signal (delay signal) switched to the logical value according to the logical value of the output signal RSOUT as the latch execution instruction signal LATSTOP at the first timing (the timing t3 at which the output signal RSOUT is delayed by a predetermined time and inverted).

Thus, the AD conversion circuit 3 including the time detection circuit of the third embodiment does not malfunction even when a plurality of different AD conversion circuits 3 operate simultaneously and the power supply voltage or the GND fluctuates in a configuration in which a plurality of AD conversion circuits 3 are simultaneously included (for example, a column ADC type solid-state imaging device), similar to the AD conversion circuit including the time detection circuit of the first and second embodiments. That is, in the time detection circuit of the third embodiment, the length of the time interval indicating the magnitude of the analog signal Vin can be detected normally without there being an influence due to a fluctuation in the power supply voltage or the GND using the configuration of the pulse generation circuit 321 in the latch control circuit 32 (particularly, the configuration in which the RS flip-flop 1212 is included in the path for generating the latch execution instruction signal LATSTOP).

Moreover, the pulse generation circuit 321 operates the latch circuit 1222 in the latch unit 222 only in a short period from the latch startup instruction signal LATSTRT to the latch execution instruction signal LATSTOP, and stops the latch circuit 1222 in the latch unit 222 in other periods of time, similar to the AD conversion circuit including the time detection circuit of the first and second embodiments. Thus, in the AD conversion circuit 3 including the time detection circuit of the third embodiment, it is possible to achieve the same effects as those in the AD conversion circuit including the time detection circuit of the first and second embodiments. That is, it is possible to realize low power consumption while maintaining the resolution of the analog-to-digital conversion.

Although the configuration in which the RS flip-flop 1212 is included in the pulse generation circuit 321 has been shown in the time detection circuit of the third embodiment shown in FIG. 5, the same operation may be realized in a combination of a different flip-flop or a different circuit element as long as the circuit element performs the same operation as that of the RS flip-flop 1212, similar to the time detection circuit of the first and second embodiments.

Further, the number of INV circuits constituting the delay circuit 3212 included in the time detection circuit of the third embodiment shown in FIG. 5 is not limited to the configuration shown in FIG. 5.

Further, in the time detection circuit of the third embodiment shown in FIG. 5, a delay circuit may be included in the path of the comparison signal CO (=latch startup instruction signal LATSTRT), as in the time detection circuit of the second embodiment, instead of the delay circuit 3212 being included only in the path for generating the latch execution instruction signal LATSTOP. However, in the time detection circuit of the third embodiment, it is necessary to ensure a pulse width of the "high" level of the latch driving signal Hold_L (that is, to maintain a relationship between the latch startup instruction signal LATSTRT and the latch execution instruction signal LATSTOP).

As described above, the time detection circuit of the first to third embodiments includes a circuit element that holds the logic of the input signal (the RS flip-flop 1212 in the time detection circuit of the first to third embodiments) in the path for generating the latch execution instruction signal LATSTOP. Accordingly, in the time detection circuit of the first to third embodiments, even when the power supply voltage or the GND of the time detection circuit fluctuates, it is possible to detect the length of the time normally without there being an influence due to the fluctuation.

Further, the time detection circuit of the first to third embodiments performs an operation of capturing a logic state (phase state) of the plurality of clock signals CK with different phases only in a short period from the latch startup instruction signal LATSTRT to the latch execution instruction signal LATSTOP, and stops the operation in other periods of time. Thus, in the time detection circuit of the first to third embodiments, it is possible to reduce power consumption when the length of the time is detected, in a state in which resolution of detection of the length of the time is maintained.

Thus, in each AD conversion circuit including the time detection circuit of any one of the first to third embodiments, it is possible to realize low power consumption in a state in which the resolution of the analog-to-digital conversion is maintained. Moreover, by including the time detection circuit of any one of the first to third embodiments, it is possible to perform analog-to-digital conversion normally without there being an influence due to fluctuation in the power supply voltage or the GND of the AD conversion circuit. Therefore, even when the column ADC type solid-state imaging device is configured with the AD conversion circuit including the time detection circuit of any one of the first to third embodiments built for every column of the pixel array unit arranged in the solid-state imaging device, each AD conversion circuit can perform the analog-to-digital conversion normally without being influenced by operations of the other AD conversion circuits, and it is possible to realize reduction in power consumption.

Fourth Embodiment

Figure 7:
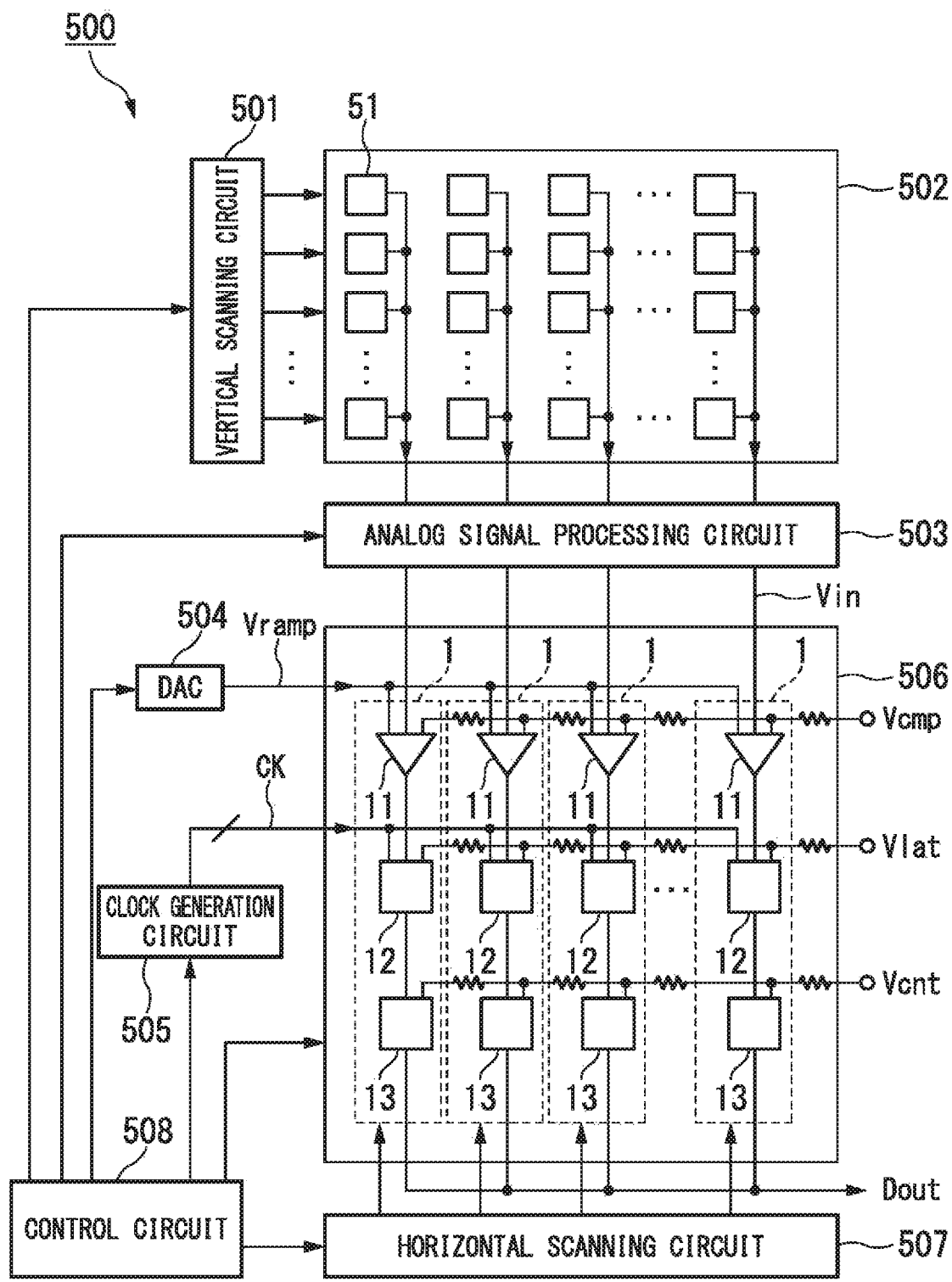
FIG. 7 is a block diagram showing a schematic configuration of a solid-state imaging device with a built-in AD conversion circuit including a time detection circuit of an embodiment of the present invention.

Next, a fourth embodiment of the present invention will be described. FIG. 7 is a block diagram showing a schematic configuration of a solid-state imaging device with a built-in AD conversion circuit including the time detection circuit of the embodiment of the present invention. In FIG. 7, an example of the column ADC type solid-state imaging device in which the column AD conversion circuit is configured by including the AD conversion circuit 1 including the time detection circuit of the first embodiment for each column of the pixel array unit is shown. In the column ADC type solid-state imaging device in which the column AD conversion circuit is configured with the AD conversion circuit including the time detection circuit of any one of the second and third embodiments, the configuration thereof is the same as the configuration of the solid-state imaging device shown in FIG. 7.

A solid-state imaging device 500 shown in FIG. 7 includes a vertical scanning circuit 501, a pixel array unit 502, an analog signal processing circuit 503, a reference signal generation unit (hereinafter referred to as a "DAC") 504, a clock generation circuit 505, a column AD conversion circuit 506, a horizontal scanning circuit 507, and a control circuit 508.

In the solid-state imaging device 500, noise is removed from the analog signal Vin_output from each pixel 51 in the pixel array unit 502 by the analog signal processing circuit 503, and then, a resultant signal is sequentially output as a digital signal Dout through analog-to-digital conversion in each AD conversion circuit 1 included in the column AD conversion circuit 506.

The vertical scanning circuit 501 selects the pixels 51 in the pixel array unit 502 in units of rows of the pixel array unit 502 according to the control signal input from the control circuit 508, and outputs the photoelectric conversion signal generated by each pixel 51 in the selected row to the analog signal processing circuit 503. In the following description, a period from selection of one row of the pixel array unit 502 to selection of the next row is referred to as a "horizontal period".

The pixel array unit 502 is a pixel array in which a plurality of pixels 51 are arranged in a two-dimensional matrix form. Each pixel 51 includes a photodiode, and the photodiode included in each pixel 51 generates a photoelectric conversion signal according to the amount of incident light in a certain accumulation time. The pixel array unit 502 outputs the photoelectric conversion signal generated by the selected pixel 51 to the analog signal processing circuit 503 according to the selection from the vertical scanning circuit 501.

The analog signal processing circuit 503 performs noise removal to remove reset noise and 1/f noise from the photoelectric conversion signal input from the pixel array unit 502 according to the control signal input from the control circuit 508, and then, amplifies the photoelectric conversion signal after noise removal. The analog signal processing circuit 503 outputs the amplified photoelectric conversion signal (pixel signal) to the column AD conversion circuit 506 as the analog signal Vin.

The DAC 504 generates the ramp wave Vramp that is a reference signal (analog signal) of which a voltage value changes (decreases) at a constant rate with respect to time in each horizontal period according to the control signal input from the control circuit 508. The DAC 504 outputs the generated ramp wave Vramp to the column AD conversion circuit 506.

The clock generation circuit 505 generates a plurality of clock signals CK with different phases at regular intervals, which is used when the column AD conversion circuit 506 performs analog-to-digital conversion, according to the control signal input from the control circuit 508. The clock generation circuit 505 outputs the generated clock signal CK to the column AD conversion circuit 506.

The column AD conversion circuit 506 includes a plurality of AD conversion circuits 1 (the AD conversion circuits 1 including the time detection circuit of the first embodiment) having the same configuration in which the comparison unit 11, the latch control circuit 12, and the counting unit 13 are included, the number of AD conversion circuits 1 corresponding to the number of columns of the pixel array unit 502. Each AD conversion circuit 1 corresponding to each column of the pixel array unit 502 performs analog-to-digital conversion on the input analog signal Vin_in in each horizontal period according to the control signal input from the control circuit 508, and sequentially outputs the digital signal Dout according to the magnitude of the analog signal Vin.

The comparison unit 11 compares the potential of the analog signal Vin_input from the analog signal processing circuit 503 with the potential of the ramp wave Vramp input from the DAC 504, and outputs the comparison signal CO to the latch control circuit 12. Each comparison unit 11 operates with the power supply voltage Vcmp.

The latch control circuit 12 holds (latches) the logic state (phase state) of each clock signal CK output from the clock generation circuit 505 on the basis of the comparison signal CO input from the comparison unit 11, and outputs phase information Lout indicating the held (latched) phase state of each clock signal CK to the counting unit 13. Further, the latch control circuit 12 outputs the clock signal CK0 for counting the number of clock signals CK to the counting unit 13. Each latch control circuit 12 operates with the power supply voltage Vlat.

The counting unit 13 counts the number of clock signal CK0 output from the latch control circuit 12. Further, the counting unit 13 generates the digital signal Dout indicating the magnitude of the analog signal Vin_on the basis of the phase information Lout output from the latch control circuit 12 and the count value Cout obtained by counting the number of clock signal CK0, and holds the digital signal Dout. The counting unit 13 sequentially outputs the held digital signal Dout according to the selection by the horizontal scanning circuit 507.

The AD conversion circuit 1 including the time detection circuit of the first embodiment includes the clock generation circuit as described above, whereas the solid-state imaging device 500 includes one clock generation circuit 505 common to all of the AD conversion circuits 1, as shown in FIG. 7.

The horizontal scanning circuit 507 selects the digital signal Dout obtained through the analog-to-digital conversion in each AD conversion circuit 1 included in the column AD conversion circuit 506 in units of columns of the pixel array unit 502 according to the control signal input from the control circuit 508, and sequentially outputs the digital signal Dout of the selected column as the digital signal Dout according to the amount of light incident on the solid-state imaging device 500.

The control circuit 508 controls the entire operation of the solid-state imaging device 500. The control circuit 508 outputs a control signal for controlling the respective components included in the solid-state imaging device 500 to the respective components.

With this configuration, in the solid-state imaging device 500, the analog signal processing circuit 503 performs various types of signal processing on the photoelectric conversion signal generated by each pixel 51 in the pixel array unit 502 to acquire the analog signal Vin. Thereafter, the column AD conversion circuit 506 performs analog-to-digital conversion on the acquired analog signal Vin_in units of rows to generate a digital signal Dout. The horizontal scanning circuit 507 sequentially outputs the digital signal Dout generated by the column AD conversion circuit 506 for each column to thereby output the digital signal Dout corresponding to all the pixels 51 in the pixel array unit 502.

According to the fourth embodiment, the solid-state imaging device (solid-state imaging device 500) is configured in which the pixel array unit (the pixel array unit 502) in which a plurality of pixels (the pixels 51) that generate a photoelectric conversion signal according to the amount of incident light are arranged in a two-dimensional matrix form, the reference signal generation unit (the DAC 504) that generates the ramp wave (the ramp wave Vramp) that is an analog reference signal of which a potential monotonically decreases or monotonically increases at a constant rate with respect to time, and a plurality of AD conversion circuits (the AD conversion circuits 1) that are arranged for each column or each plurality of columns of the pixel array unit 502 and output a digital signal (the digital signal Dout) indicating the magnitude of the pixel signal according to the photoelectric conversion signal generated by the pixels 51, in which one clock generation circuit (the clock generation circuit 505) of the AD conversion circuit 1 is common to all of the AD conversion circuits 1.

As described above, the solid-state imaging device 500 of the fourth embodiment includes the AD conversion circuit including the time detection circuit of any one of the first to third embodiments as each AD conversion circuit included in the column AD conversion circuit 506. Thus, even when the power supply voltage or the GND fluctuates due to a simultaneous operation of the plurality of AD conversion circuits in the solid-state imaging device 500, each AD conversion circuit can perform the analog-to-digital conversion normally without being influenced by the fluctuation. Further, in each AD conversion circuit, it is possible to realize low power consumption in a state in which the resolution of the analog-to-digital conversion is maintained. Thus, it is possible to achieve low power consumption of the solid-state imaging device 500.

In the fourth embodiment, the ADC type solid-state imaging device in which the column AD conversion circuit is configured by including the AD conversion circuit including the time detection circuit for each column of the pixel array unit has been described. However, the system (configuration) with the built-in AD conversion circuit including the time detection circuit or the time detection circuit is not limited to the solid-state imaging device. It is possible to obtain the same effects even when the time detection circuit or the AD conversion circuit including the time detection circuit is built into another system (configuration).

In the solid-state imaging device 500 of the fourth embodiment, the case in which the plurality of AD conversion circuits 1 having the same configuration are arranged according to the number of columns of the pixel array unit 502 in the column AD conversion circuit 506 has been described. However, the arrangement of the AD conversion circuits 1 included in the solid-state imaging device 500 is not limited to the arrangement of the solid-state imaging device 500 of the fourth embodiment. For example, a configuration in which one AD conversion circuit 1 is arranged for a plurality of columns of the pixel array unit 502 can be adopted. In this case, it is possible to realize low power consumption in a state in which the resolution of the analog-to-digital conversion is maintained, as in the solid-state imaging device 500 of the fourth embodiment.

As described above, according to the embodiment of the present invention, in the time detection circuit, the circuit element that holds the logic of the input signal (the RS flip-flop 1212 in the time detection circuit of the first to third embodiments) is included in the path in which the latch unit generates the signal indicating the timing at which the latch unit ends the operation of capturing the phase states of the plurality of clock signals with different phases and holds (latches) the phase states of the clock signals. Accordingly, in the embodiment of the present invention, even when the power supply voltage or the GND of the time detection circuit fluctuates, a malfunction in which different phase states are held (latched) at a timing other than the timing at which the phase states of the clock signals are held (latched) is not caused under an influence of the fluctuation. That is, according to the embodiment of the present invention, in the time detection circuit, it is possible to hold (latch) the phase states of the plurality of clock signals with different phases normally. Thus, in the embodiment of the present invention, in the AD conversion circuit including the time detection circuit or in the solid-state imaging device including the AD conversion circuit, it is possible to perform the analog-to-digital conversion normally and to realize low power consumption.

The configuration of the time detection circuit is not limited to the configuration shown in each embodiment as described above. That is, the configuration of the circuit element for realizing each function is not limited to the configuration shown in the embodiments as long as the configuration is capable of realizing the function of the time detection circuit shown in each embodiment. For example, the configuration of the circuit elements in the time detection circuit is not limited to the configuration shown in the embodiments as long as the configuration is a configuration in which a timing at which the latch execution instruction signal LATSTOP is inverted is later than a timing at which the latch startup instruction signal LATSTRT is inverted. Further, although, for example, the configuration in which the RS flip-flop 1212 is arranged in the path for generating the latch execution instruction signal LATSTOP has been described in the configuration of the time detection circuit of each embodiment, the RS flip-flop may be arranged in the path for generating the latch startup instruction signal LATSTRT.

In the embodiment, the configuration in which the latch control circuit constituting the time detection circuit outputs each of the latch startup instruction signal LATSTRT and the latch execution instruction signal LATSTOP for controlling the timing at which the latch unit holds (latches) the logic state (phase state) of the clock signal CK, and the latch driving signal Hold_L indicating the period in which the latch circuit operates is generated in the latch unit has been described. However, the configuration for generating the latch driving signal Hold_L is not limited to the configuration shown in the embodiment. For example, a configuration in which the latch driving signal Hold_L is generated in the latch control circuit may be adopted. Further, a component such as a waveform generation circuit that generates the latch driving signal Hold_L may be included between the latch control circuit and the latch unit.

In the embodiment, the case in which the column ADC type solid-state imaging device in which the AD conversion circuit including the time detection circuit is included for one column of the pixel array unit is adopted as an example, and the power supply voltage or the GND fluctuates due to a simultaneous operation of a plurality of different AD conversion circuits has been described as the configuration in which the power supply voltage or the GND of the time detection circuit fluctuates. However, the configuration in which the power supply voltage or the GND of the time detection circuit fluctuates is conceivable in devices other than the column ADC type solid-state imaging device. Further, the fluctuation in the power supply voltage or the GND is also conceivable for some reasons in a configuration in which a plurality of time detection circuits are not included, such as a configuration in which only one time detection circuit is included. In this case, in the time detection circuit of the present invention, it is possible to realize normal holding (latching) of the phase states of the plurality of clock signals with different phases, and reduction in power consumption without there being an influence due to the fluctuation in the power supply voltage or the GND.

Although the case in which the potential of the ramp wave Vramp decreases over time has been described in the embodiment, the concept of the present invention is similarly applicable to a case in which the potential of the ramp wave Vramp increases over time.

Further, in the embodiment, the case in which the potential of the output signal (which may be the comparison signal CO) output by the comparator 111 increases from the timing at which the potential of the analog signal Vin matches the potential of the ramp wave Vramp has been described. However, the concept of the present invention is similarly applicable to a case in which, on the contrary, the potential of the output signal output by the comparator 111 decreases from the timing at which the potential of the analog signal Vin matches the potential of the ramp wave Vramp. In this case, for example, in the time detection circuit of the second embodiment shown in FIG. 3, the INV circuit INV_LVth with the low input threshold voltage Vth may be included in the delay circuit 2211, the INV circuit INV_HVth with the high input threshold voltage Vth may be included in the delay circuit 2212, and the NOR circuit 2221 may be replaced with an AND circuit. Thus, the time detection circuit having this configuration performs the same operation as that of the time detection circuit of the second embodiment shown in FIG. 4. That is, it is possible to obtain the same signal as the latch driving signal Hold_L shown in FIG. 4.

In the embodiment, the resolution when the time detection circuit detects the length of the time interval (that is, resolution of the analog-to-digital conversion in the AD conversion circuit) is not defined. That is, the concept of the time detection circuit of the present invention is applicable regardless of the number of the plurality of clock signals CK with different phases at regular intervals or the number of latch circuits corresponding to the respective clock signals CK.

Further, in the fourth embodiment, an example of the configuration of the solid-state imaging device 500 having the configuration in which the analog signal processing circuit 503 amplifies the photoelectric conversion signal after noise removal is performed on the photoelectric conversion signal input from the pixel array unit 502 and outputs a resultant signal to the column AD conversion circuit 506 as the analog signal Vin has been described. However, the configuration of the solid-state imaging device 500 is not limited to the configuration shown in the fourth embodiment. For example, a solid-state imaging device having a configuration in which the photoelectric conversion signal obtained by the pixel array unit 502 or each pixel 51 in the pixel array unit 502 performing the noise removal and the amplification is output to the column AD conversion circuit 506 as the analog signal Vin may be adopted.

While preferred embodiments of the present invention have been described and shown above, it should be understood that these are exemplary of the invention and the present invention is not limited to the embodiments and the modification examples thereof. Additions, omissions, substitutions, and other modifications of the configuration can be performed without departing from the spirit or scope of the present invention.

Further, the present invention is not to be considered as being limited by the foregoing description, and is limited only by the scope of the appended claims.

What is claimed is:

1. A time detection circuit, comprising:
a latch unit that starts an operation of capturing a data signal according to a startup instruction signal, and holds the data signal and ends the capturing operation at a timing at which an execution instruction signal is input during the capturing operation;
a first signal path that transfers a latch timing signal that transitions from a low potential to a high potential or from a high potential to a low potential taking a predetermined time, as the startup instruction signal; and
a second signal path that transfers the latch timing signal into the execution instruction signal, the second signal path being different from the first signal path,
wherein a first logic element that outputs a first output signal switched to a logical value of the first output signal being determined according to a logical value of an input signal at a first predetermined timing, and a signal maintenance logic circuit that continues to output a second output signal with a predetermined logical value determined according to the logical value of the input signal until the logical value is switched to a logical value indicating that a logical value of an input reset signal is initialized is arranged in the second signal path.

2. The time detection circuit according to claim 1,
wherein the first logic element receives the latch timing signal as the input signal, and outputs the first output signal switched to the logical value of the first output signal determined according to a logical value of the latch timing signal at the first predetermined timing,
the signal maintenance logic circuit is arranged in the second signal path on the output side of the first logic element, and
the signal maintenance logic circuit is configured to transfer the second output signal into the execution instruction signal.

3. The time detection circuit according to claim 2,
wherein a logical value of a third output signal is determined according to the logical value of the input signal, and a second logic element that outputs the third output signal switched to a logical value determined according to the logical value of the input signal at a second predetermined timing different from the first predetermined timing is arranged in the first signal path, and
the second predetermined timing is a timing at which the logical value of the third output signal is switched before a timing at which the logical value of the first output signal is switched when same signals are simultaneously input as the input signal of the first logic element and the input signal of the second logic element, respectively.

4. The time detection circuit according to claim 3,
wherein the first logic element outputs the first output signal switched to a logical value determined according to the logical value of the latch timing signal at a timing at which a potential of the latch timing signal input as the input signal exceeds a first predetermined threshold value during a transition period of the latch timing signal from the low potential to the high potential, or at a timing at which the potential of the latch timing signal input as the input signal falls below the first predetermined threshold value during a transition period of the latch timing signal from the high potential to the low potential,
the second logic element outputs the third output signal switched to the logical value determined according to the logical value of the latch timing signal at a timing at which the potential of the latch timing signal input as the input signal exceeds a second predetermined threshold value during the transition period of the latch timing signal from the low potential to the high potential, or at a timing at which the potential of the latch timing signal input as the input signal falls below the second predetermined threshold value during the transition period of the latch timing signal from the high potential to the low potential, the second predetermined threshold value being different from the first predetermined threshold value, and
the second threshold value is a threshold value to which the logical value of the third output signal is switched at a timing before a timing at which the logical value of the first output signal is switched when same latch timing signals are simultaneously input as the input signal of the first logic element and the second logic element, respectively.

5. The time detection circuit according to claim 1,
wherein the signal maintenance logic circuit receives the latch timing signal as the input signal, and outputs the second output signal determined according to the logical value of the latch timing signal, the first logic element is arranged in the second signal path on the output side of the signal maintenance logic circuit, and the first logic element is configured to transfer the first output signal into the execution instruction signal.

6. The time detection circuit according to claim 1, further comprising:

a logical product circuit configured to generate a latch driving signal for driving the latch unit on the basis of the startup instruction signal and the execution instruction signal.

7. An AD conversion circuit, comprising:

a signal output unit that compares a potential of an input analog signal with a potential of a ramp wave that is an analog reference signal of which a potential monotonously decreases or monotonously increases at a constant rate with respect to time, and outputs a latch timing signal that transitions from a low potential to a high potential or from a high potential to a low potential taking a predetermined time from a time at which the potential of the ramp wave satisfies a predetermined condition for a potential of an analog signal;

a clock generation circuit that generates a plurality of clock signals with different phases at predetermined regular intervals;

the time detection circuit according to claim 1 that holds states of phases of the plurality of clock signals in the latch unit, and outputs phase information indicating the held phase states of the plurality of clock signals; and a counting unit that outputs a count value obtained by counting the number of any one of the plurality of clock signals, wherein a digital signal indicating a magnitude of the input analog signal is output on the basis of the count value and the phase information.

8. A solid-state imaging device, comprising:

a pixel array unit in which a plurality of pixels that generate a photoelectric conversion signal according to an amount of incident light are arranged in a two-dimensional matrix form;

a reference signal generation unit that generates a ramp wave that is an analog reference signal of which a potential monotonically decreases or monotonically increases at a constant rate with respect to time;

a clock generation circuit; and a plurality of AD conversion circuits that are arranged for each column or each plurality of columns of the pixel array unit and output a digital signal indicating a magnitude of the pixel signal according to the photoelectric conversion signal generated by the pixels, each of the AD conversion circuits includes:

a signal output unit that compares a potential of an input analog signal with a potential of a ramp wave that is an analog reference signal of which a potential monotonously decreases or monotonously increases at a constant rate with respect to time, and outputs a latch timing signal that transitions from a low potential to a high potential or from a high potential to a low potential taking a predetermined time from a time at which the potential of the ramp wave satisfies a predetermined condition for the potential of the analog signal;

the time detection circuit according to claim 1 that holds states of phases of the plurality of clock signals in the latch unit, and outputs phase information indicating the held phase states of the plurality of clock signals; and a counting unit that outputs a count value obtained by counting the number of any one of the plurality of clock signals, wherein a digital signal indicating a magnitude of the input analog signal is output on the basis of the count value and the phase information, wherein the clock generation circuit is common to all of the AD conversion circuits.

* * * * *